United States Patent
Lee et al.

(10) Patent No.: US 11,336,269 B2
(45) Date of Patent: May 17, 2022

(54) CLOCK GATING CELL WITH LOW POWER AND INTEGRATED CIRCUIT INCLUDING THE SAME

(71) Applicant: SAMSUNG ELECTRONICS CO., LTD., Suwon-si (KR)

(72) Inventors: Dalhee Lee, Seoul (KR); Byounggon Kang, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/886,187

(22) Filed: May 28, 2020

(65) Prior Publication Data
US 2021/0135659 A1 May 6, 2021

(30) Foreign Application Priority Data

Oct. 30, 2019 (KR) .................. 10-2019-0136905

(51) Int. Cl.
*H03K 3/037* (2006.01)
*H03K 19/20* (2006.01)
*G06F 1/04* (2006.01)

(52) U.S. Cl.
CPC .............. *H03K 3/037* (2013.01); *G06F 1/04* (2013.01); *H03K 19/20* (2013.01)

(58) Field of Classification Search
CPC .. H03K 3/037; H03K 3/012; H03K 3/356113; H03K 19/20; H03K 19/0016; H03K 19/0013; G06F 1/04; G06F 1/06; G06F 1/08; G06F 1/3206; G06F 1/3237; G06F 1/3287
See application file for complete search history.

(56) References Cited

U.S. PATENT DOCUMENTS

| | | | |
|---|---|---|---|
| 6,809,570 B2 | 10/2004 | Francom | |
| 8,030,982 B2 | 10/2011 | Datta et al. | |
| 9,246,489 B1 | 1/2016 | Nandi et al. | |
| 9,270,270 B2* | 2/2016 | Cai | H03K 19/0016 |
| 9,362,910 B2 | 6/2016 | Gurumurthy et al. | |
| 9,564,897 B1 | 2/2017 | Berzins et al. | |
| 9,577,635 B2* | 2/2017 | Rasouli | H03K 19/0016 |
| 9,755,618 B1* | 9/2017 | Rasouli | H03K 3/356104 |

(Continued)

OTHER PUBLICATIONS

Martin Saint-Laurent et al. "A Low-Power Clock Gating Cell Optimized for Low-Voltage Operation in a 45-nm Technology" Qualcomm Inc., 2010, (pp. 159-163).

*Primary Examiner* — John W Poos
(74) *Attorney, Agent, or Firm* — Sughrue Mion, PLLC

(57) ABSTRACT

An integrated circuit may include a clock gating cell based. The clock gating cell may include a first 2-input logic gate configured to receive a clock input and a first signal and generate a second signal, an inverter configured to receive the second signal and generate a clock output, and a 3-input logic gate including a second 2-input logic gate configured to generate the first signal. The first 2-input logic gate and the second 2-input logic gate form a set reset (SR) latch by being cross-coupled, the 3-input logic gate includes a feedback transistor configured to exclusively receive an internal signal of the first 2-input logic gate, and an activation of the feedback transistor by the internal signal is configured to avoid a race condition by preventing a pull-up or a pull-down of a first node at which the first signal is generated.

20 Claims, 21 Drawing Sheets

(56) References Cited

U.S. PATENT DOCUMENTS

| | | |
|---|---|---|
| 10,298,235 B2 | 5/2019 | Lim et al. |
| 2010/0164576 A1* | 7/2010 | Masleid ................ H03K 3/012 327/161 |
| 2017/0366170 A1* | 12/2017 | Wang ................ H03K 3/35625 |

* cited by examiner

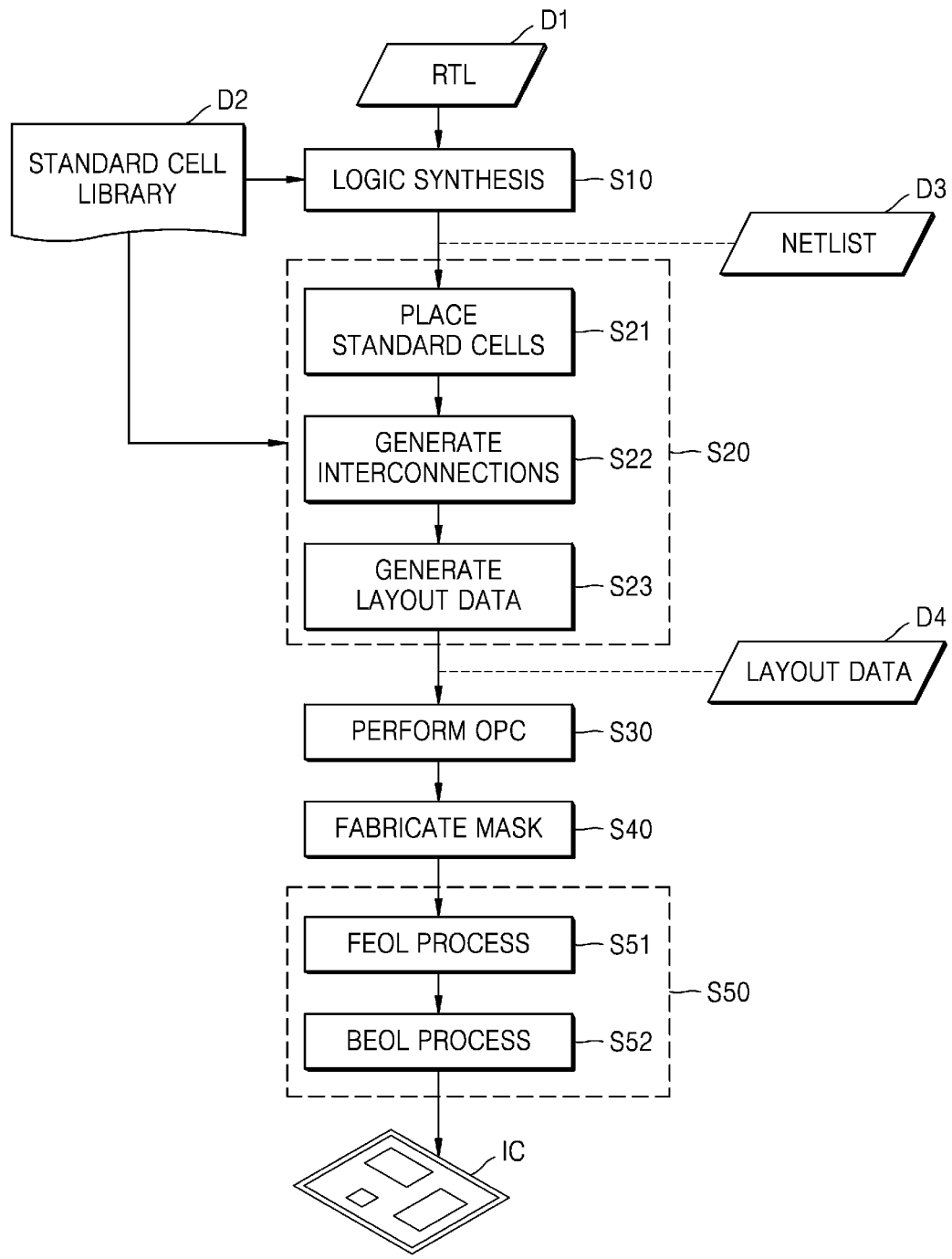

CLOCK GATING CELL WITH LOW POWER AND INTEGRATED CIRCUIT INCLUDING THE SAME

CROSS-REFERENCE TO RELATED APPLICATIONS

This application claims priority from Korean Patent Application No. 10-2019-0136905, filed on Oct. 30, 2019, in the Korean Intellectual Property Office, the disclosure of which is incorporated herein in its entirety by reference.

BACKGROUND

The present disclosure relates to a clock gating cell, and more particularly to, a clock gating cell with low power and an integrated circuit including the same.

An integrated circuit that processes digital signals may operate in synchronization with a clock signal. For example, an integrated circuit may include a digital circuit that generates an output signal by processing an input signal in response to a rising edge and/or a falling edge of a clock signal. When a clock edge does not occur, the operation of the digital circuit may be interrupted. Clock gating may refer to stopping or resuming the operation of a digital circuit by selectively providing a clock signal, and power consumed by the digital circuit may be reduced by clock gating.

An integrated circuit may include a clock gating circuit, that is, a clock gating cell that selectively outputs a clock signal in response to a control signal, wherein the clock gating cell may be required to stop and resume the supply of a clock signal to prevent malfunction of a digital circuit receiving the clock signal and, at the same time, may be required to have high efficiency, e.g., reduced area and low power consumption.

SUMMARY

Example embodiments provide a clock gating cell for performing clock gating with reduced area and low power consumption and an integrated circuit including the clock gating cell.

According to an aspect of an example embodiment, there is provided an integrated circuit including a clock gating cell, wherein the clock gating cell includes: a first 2-input logic gate configured to receive a clock input and a first signal and generate a second signal; an inverter configured to receive the second signal and generate a clock output; and a 3-input logic gate including a second 2-input logic gate configured to generate the first signal, wherein the first 2-input logic gate and the second 2-input logic gate form a set reset (SR) latch by being cross-coupled, the 3-input logic gate includes a feedback transistor configured to exclusively receive an internal signal of the first 2-input logic gate, and an activation of the feedback transistor by the internal signal is configured to avoid a race condition by preventing a pull-up or a pull-down of a first node at which the first signal is generated.

According to an aspect of an example embodiment, there is provided a clock gating cell including: a first NAND gate configured to receive a clock input and a first signal and generate a second signal; an inverter configured to receive the second signal and generate a clock output; and a 2-1 OR-AND-INVERTER (OAI) gate including a second NAND gate configured to generate the first signal, wherein the first NAND gate and the second NAND gate form a set reset (SR) latch by being cross-coupled, and wherein the 2-1 OAI gate includes: a first n-channel field effect transistor (NFET) configured to receive an inverted enable input; a second NFET configured to receive the second signal; a third NFET configured to receive the clock input; and a fourth NFET connected in series with the third NFET between a first node at which the first signal is generated and a ground node, the fourth NFET being configured to exclusively receive an internal signal of the first NAND gate to avoid a race condition.

According to an aspect of an example embodiment, there is provided a clock gating cell including: a first NOR gate configured to receive a clock input and a first signal and generate a second signal; an inverter configured to receive the second signal and generate a clock output; and a 2-1 AND-OR-INVERTER (AOI) gate including a second NOR gate configured to generate the first signal, wherein the first NOR gate and the second NOR gate form a set reset (SR) latch by being cross-coupled, and wherein the 2-1 AOI gate includes: a first p-channel field effect transistor (PFET) configured to receive an enable input; a second PFET configured to receive the second signal; a third PFET configured to receive the clock input; and a fourth PFET connected in series with the third PFET between a first node at which the first signal is generated and a positive power supply node, wherein the fourth PFET is configured to exclusively receive an internal signal of the first NOR gate, and an activation of the fourth PFET is configured to avoid a race condition.

BRIEF DESCRIPTION OF THE DRAWINGS

The above and/or other aspect will be more clearly understood from the following detailed description taken in conjunction with the accompanying drawings in which:

FIG. 11 is a flowchart of a method of manufacturing an integrated circuit according to an example embodiment.

DETAILED DESCRIPTION

Herein, logic '1' may correspond to a high voltage, e.g., a positive supply voltage VDD or a voltage close to the positive supply voltage VDD and may be referred to as a high level or an active state, whereas logic '0' may correspond to a low voltage, e.g., a ground potential or a voltage close to the ground potential, and may be referred to as a low level or an inactive state. Also, a ground node may refer to a node to which the ground potential (or a negative supply voltage) is applied, whereas a positive power supply node may refer to a node to which the positive supply voltage VDD is applied. Also, in this specification, transistors may have arbitrary structures that provide complementary transistors (e.g., an n-channel transistor and a p-channel transistor), and, as non-limiting examples, may be implemented as planar field effect transistors (FETs), fin field effect transistors (FinFETs), gate all around field effect transistors (GAAFETs), vertical field effect transistors (VFETs), etc.

Figure 1:
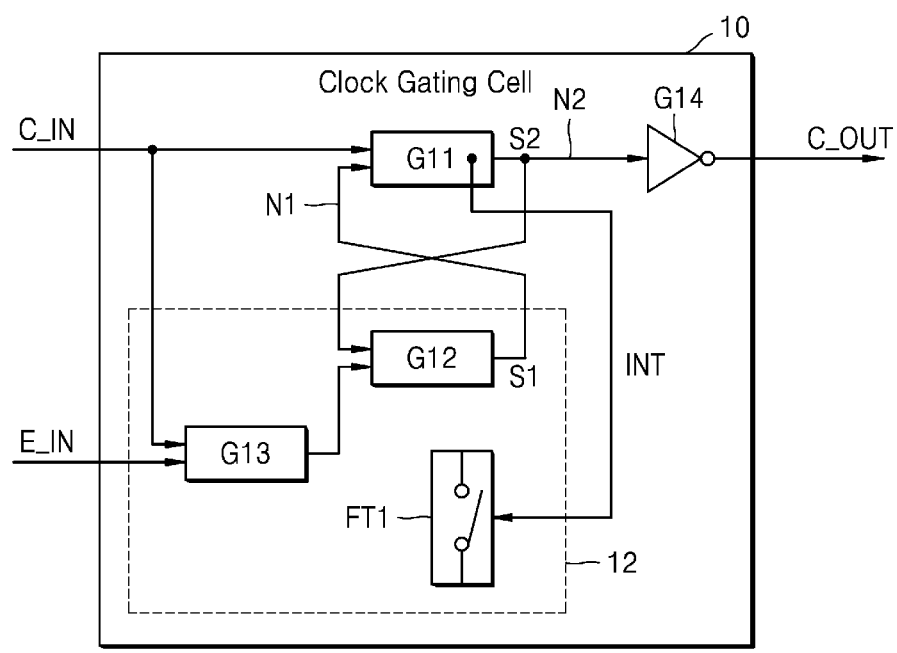
FIG. 1 is a block diagram showing an example of a clock gating cell according to an example embodiment.

FIG. 1 is a block diagram showing an example of a clock gating cell according to an example embodiment. In some embodiments, a clock gating cell 10 may be included in an integrated circuit manufactured through a semiconductor process and may be referred to as a clock gating circuit or an integrated clock gating cell.

Referring to FIG. 1, the clock gating cell 10 may receive a clock input C_IN and an enable input E_IN and generate a clock output C_OUT. The clock output C_OUT may oscillate like the clock input C_IN or be maintained at a constant voltage level according to the enable input E_IN. For example, the clock gating cell 10 may be in an enabled state in response to an active enable input E_IN and may generate the clock output C_OUT that oscillates according to the clock input C_IN in the enabled state. Also, the clock gating cell 10 may be in a disabled state in response to an inactive enable input E_IN and may generate the clock output C_OUT of a certain level, e.g., logic '1' or logic '0', in the disabled state. In the present specification, it may be considered that the clock gating cell 10 in the enabled state supplies the clock output C_OUT and the clock gating cell 10 in the disabled state stops supplying the clock output C_OUT.

To prevent malfunction of a digital circuit receiving the clock output C_OUT, the clock gating cell 10 may stop or resume the supply of the clock output C_OUT in synchronization with the clock input C_IN. In some embodiments, as described below with reference to FIGS. 2 to 5B, the clock gating cell 10 may stop or resume the supply of the clock output C_OUT in response to a rising edge of the clock input C_IN and supply the clock output C_OUT to a digital circuit that operates in response to the rising edge of the clock output C_OUT, e.g., a positive edge triggered flip-flop. Also, in some embodiments, as described below with reference to FIGS. 6 to 9C, the clock gating cell 10 may stop or resume the supply of the clock output C_OUT in response to a falling edge of the clock input C_IN and supply the clock output C_OUT to a digital circuit that operates in response to the falling edge of the clock output C_OUT, e.g., a negative edge triggered flip-flop. To operate in synchronization with the clock input C_IN, the clock gating cell 10 may include a set-reset (SR) latch structure and may latch the enable input E_IN according to the clock input C_IN. As shown in FIG. 1, the clock gating cell 10 may include a first 2-input logic gate G11, a 3-input logic gate 12, and an inverter G14.

The first 2-input logic gate G11 may receive the clock input C_IN and a first signal S1 and generate a second signal S2 by performing a logical operation on the clock input C_IN and the first signal S1. The first 2-input logic gate G11 may be cross-coupled with a second 2-input logic gate G12 provided by the 3-input logic gate 12 to form an SR latch. The first 2-input logic gate G11 and the second 2-input logic gate G12 may be NAND gates in some embodiments and may be NOR gates in some other embodiments. The second signal S2 generated by the first 2-input logic gate G11 may be provided to the inverter G14, and the inverter G14 may generate the clock output C_OUT by inverting the second signal S2.

The 3-input logic gate 12 may receive the enable input E_IN, the clock input C_IN, and the second signal S2 and generate the first signal S1 by performing a logical operation on the enable input E_IN, the clock input C_IN, and the second signal S2 according to the second 2-input logic gate G12 and a third 2-input logic gate G13. Although FIG. 1 shows that the 3-input logic gate 12 includes the second 2-input logic gate G12 and the third 2-input logic gate G13, FIG. 1 shows an equivalent circuit of the 3-input logic gate 12, and the 3-input logic gate 12 may provide functions equivalent to those of the second 2-input logic gate G12 and the third 2-input logic gate G13 that are connected and receive input signals as shown in FIG. 1. For example, in the 3-input logic gate 12, the second 2-input logic gate G12 and the third 2-input logic gate G13 may share at least one component, e.g., at least one transistor, and may not be separated from each other. In some embodiments, the second 2-input logic gate G12 may include a NAND gate and the third 2-input logic gate G13 may include an OR gate, and thus, the 3-input logic gate 12 may include a 2-1 OAI (OR-AND-INVERTER) gate. Also, in some embodiments, the second 2-input logic gate G12 may include a NOR gate and the third 2-input logic gate G13 may include an AND gate, and thus, the 3-input logic gate 12 may be a 2-1 AOI (AND-OR-INVERTER) gate.

As shown in FIG. 1, the clock gating cell 10 may omit a circuit element (e.g., an inverter for generating an inverted clock input) that oscillates according to the oscillation of the clock input C_IN in the disabled state, and thus, the clock gating cell 10 may exhibit reduced power consumption in the disabled state. In addition, as described below with reference to the drawings, the number of transistors receiving the clock input C_IN may be reduced, and, due to reduced input capacitance of the clock input C_IN, not only power consumption by the clock input C_IN, but also delay of the clock input C_IN may be reduced.

The 3-input logic gate 12 may include a feedback transistor FT1, as shown in FIG. 1. The feedback transistor FT1 may receive an internal signal INT of the first 2-input logic gate G11 and may be controlled by the internal signal INT. To avoid a race condition, the feedback transistor FT1 may prevent pull-down (or discharging) or pull-up (or charging) of a first node N1 at which the first signal S1 is generated in response to the internal signal INT. The feedback transistor FT1 may exclusively receive the internal signal INT of the first 2-input logic gate G11, and, in the first 2-input logic gate G11 and the 3-input logic gate 12, additional components other than the feedback transistor FT1 may be omitted to avoid race conditions. In other words, the first 2-input logic gate G11 may have only a structure for a logic operation except for a structure for outputting the internal signal INT to the outside, and the 3-input logic gate 12 may have only a structure for a logic operation except for the feedback transistor FT1. Therefore, race conditions in the clock gating cell 10 may be simply avoided, and thus, the clock gating cell 10 may have a reduced area as well as high operational reliability.

Figure 2:
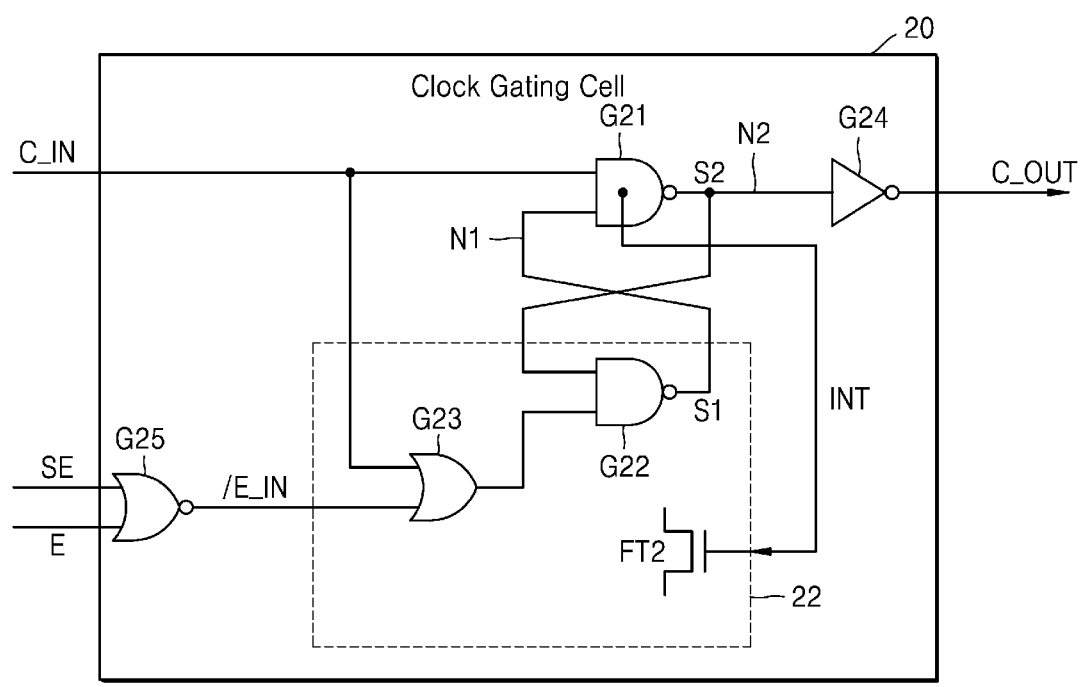
FIG. 2 is a block diagram showing a clock gating cell according to an example embodiment.
Figure 3:
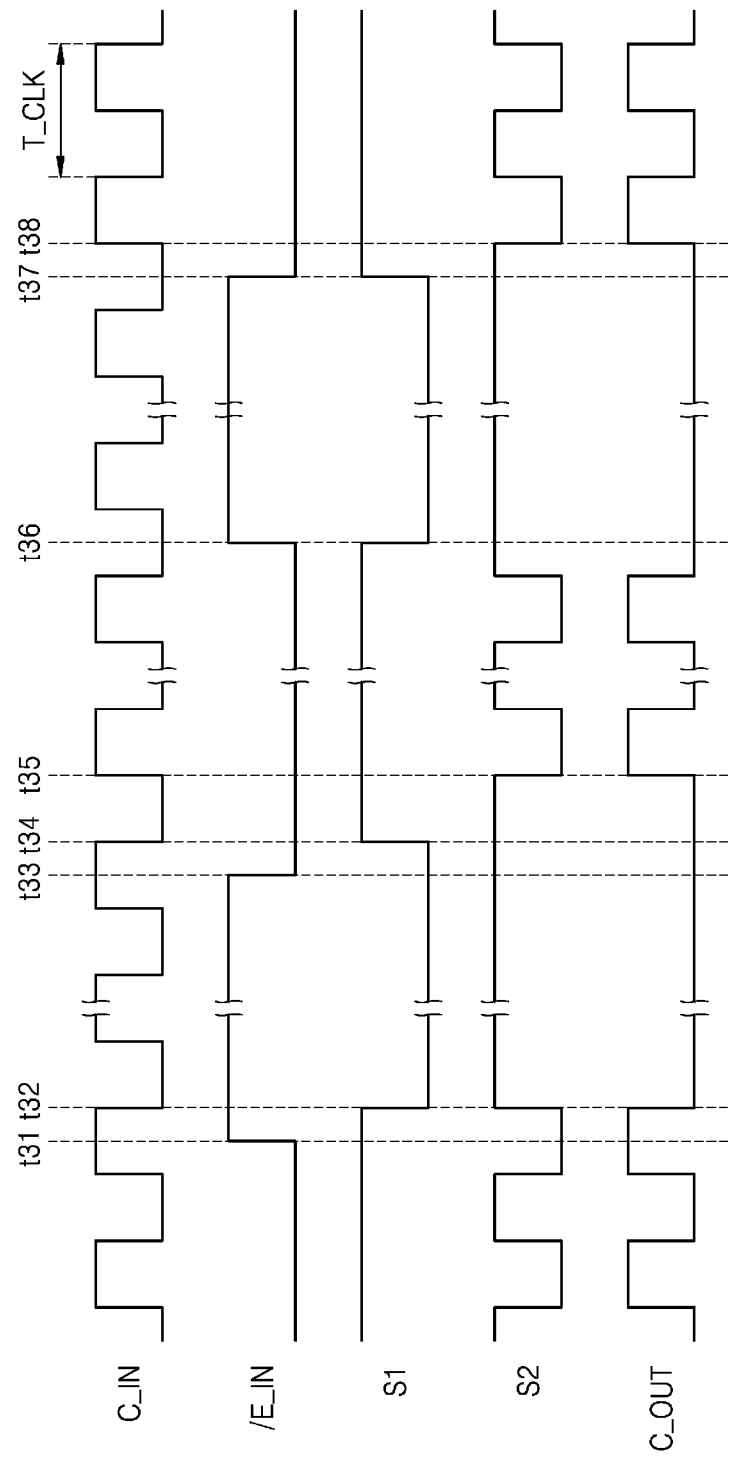
FIG. 3 is a timing diagram showing an example of the operation of a clock gating cell according to an example embodiment.

FIG. 2 is a block diagram showing an example of a clock gating cell according to an example embodiment, FIG. 3 is a timing diagram showing an example of an operation of a clock gating cell according to an example embodiment. In detail, the block diagram of FIG. 2 shows a clock gating cell 20 that generates the clock output C_OUT that is logic '0' in the disabled state as an example of the clock gating cell 10 of FIG. 1, and the timing diagram of FIG. 3 shows signals according to the lapse of time in the clock gating cell 20 of FIG. 2. For convenience of illustration, propagation delay may be ignored in the timing diagram of FIG. 3, and descriptions of FIGS. 2 and 3, identical to those given above with reference to FIG. 1, will be omitted.

Referring to FIG. 2, the clock gating cell 20 may include a first NAND gate G21, a 2-1 OAI gate 22, and an inverter G24, similar to the clock gating cell 10 of FIG. 1, and may further include a NOR gate G25. The NOR gate G25 may receive a clock enable E and a test enable SE, generate an inverted enable input /E_IN, and provide the inverted enable input /E_IN to the 2-1 OAI gate 22. In other embodiments, unlike as shown in FIG. 2, the NOR gate G25 may be omitted, and thus, the clock gating cell 20 may directly receive the inverted enable input /E_IN from the outside. Also, in other embodiments, unlike as shown in FIG. 2, the clock gating cell 20 may include an inverter that generates the inverted enable input /E_IN from the enable input E_IN of FIG. 1 instead of the NOR gate G25.

The first NAND gate G21 may form an SR latch (or an SR NAND latch) together with a second NAND gate G22 provided by the 2-1 OAI gate 22. For example, as shown in FIG. 2, the first NAND gate G21 and the second NAND gate G22 may be cross-coupled through the first node N1 and a second node N2. The first NAND gate G21 may generate the second signal S2 dependent on the clock input C_IN when the first signal S1 is logic '1' and may generate the second signal S2 regardless of the clock input C_IN when the first signal S1 is logic '0'. The 2-1 OAI gate 22 may generate the first signal S1 by performing a logical operation on the inverted enable input /E_IN, the clock input C_IN, and the second signal S2 according to the second NAND gate G22 and an OR gate G23.

Referring to FIG. 3, the clock input C_IN may oscillate at a period T_CLK. Before a time point t31, the clock enable E and/or the test enable SE may be logic '1'. Therefore, the inverted enable input /E_IN may be logic '0', and the clock gating cell 20 may be in the enabled state. Due to the second NAND gate G22, the first signal S1 may be logic '1' and the second signal S2 may be identical to the inverted version of the clock input C_IN, and thus, the clock output C_OUT may be identical to the clock input C_IN (e.g., a delayed version of the clock input C_IN).

At a time point t31, the clock enable E and the test enable SE may be transited to logic '0'. Therefore, the inverted enable input /E_IN may be transited to logic '1', and the clock gating cell 20 may enter the disabled state. Since the clock input C_IN is logic '1', the first signal S1 may be maintained at logic '1', and the second signal S2 and the clock output C_OUT may also be maintained at logic '0' and logic '1', respectively. Next, at a time point t32, a falling edge of clock input C_IN may occur, and thus, the second signal S2 and the clock output C_OUT may be transited to logic '1' and logic '0' by the first NAND gate G21, respectively. Also, the first signal S1 may be transited to logic '0' by the second NAND gate G22, and thus, due to the first NAND gate G21, the second signal S2 may maintain logic '1' regardless of the clock input C_IN. As a result, the clock output C_OUT may maintain logic '0' while the clock gating cell 20 is in the disabled state.

At a time point t33, the clock enable E and the test enable SE may be transited to logic '1'. Therefore, the inverted enable input /E_IN may be transited to logic '0', and the clock gating cell 20 may enter the enabled state. Since the clock input C_IN and the second signal S2 are logic '1', first signal S1 may maintain logic '0', and thus, the second signal S2 and the clock output C_OUT may also maintain logic '1' and logic '0', respectively. Next, at a time point t34, a falling edge of the clock input C_IN may occur, and thus, the first signal S1 may be transited to logic '1' by the second NAND gate G22. However, since the clock input C_IN is logic '0', the second signal S2 and the clock output C_OUT may maintain logic '1' and logic '0', respectively. Next, at a time point t35, the rising edge of the clock input C_IN may occur, and, since the first signal S1 is logic '1', the second signal S2 and clock output C_OUT may be transited to logic '0' and logic '1', respectively.

At a time point t36, the clock enable E and the test enable SE may be transited to logic '0'. Therefore, the inverted enable input /E_IN may be transited to logic '1', and the clock gating cell 20 may enter the disabled state. Since the second signal S2 is logic '1', the first signal S1 may be transited to logic '0' by the second NAND gate G22, and thus, the second signal S2 and clock output C_OUT may maintain logic '1' and logic '0' regardless of the clock input C_IN, respectively.

At a time point t37, the clock enable E and/or the test enable SE may be transited to logic '1'. Therefore, the inverted enable input /E_IN may be transited to logic '0', and the clock gating cell 20 may enter the enabled state. Although the first signal S1 may be transited to logic '1' by the OR gate G23 and the second NAND gate G22, the clock input C_IN is logic '0', and thus, the second signal S2 and the clock output C_OUT may maintain logic '1' and logic '0', respectively. Next, at a time point t38, the rising edge of the clock input C_IN may occur, and the second signal S2 and the clock output C_OUT may be transited to logic '0' and logic '1', respectively.

As described above, the clock output C_OUT may be maintained at logic '0' following the falling edge synchronized with the clock input C_IN when the clock gating cell 20 enters the disabled state. In addition, when the clock gating cell 20 enters the enabled state, the clock output C_OUT may oscillate following the rising edge synchronized with the clock input C_IN. Therefore, the clock gating cell 20 may provide the clock output C_OUT to a digital circuit that operates in response to the rising edge of the clock output C_OUT, e.g., a positive edge triggered flip-flop, and prevent a malfunction due to a race condition affecting clock gating in the digital circuit.

Referring back to FIG. 2, the 2-1 OAI gate 22 may include a feedback transistor FT2 exclusively receiving the internal signal INT of the first NAND gate G21 to avoid a race condition. For example, when the rising edge of the clock input C_IN occurs in the enabled state of the clock gating cell 20, based on factors including a slew rate of the rising edge and a gate delay difference between the first NAND gate G21 and the OR gate G23, the rising edge of a signal output by the OR gate G23 may occur earlier than the falling edge of the second signal S2 or may occur near the falling edge of the second signal S2. Therefore, the voltage level of the first signal S1 that needs to be maintained at logic '1' may be unstable, and, as a result, an error may occur in the clock output C_OUT. The feedback transistor FT2 will avoid such a race condition by preventing pull-down (or discharging) of the first node N1 at which the first signal S1 is generated according to the internal signal INT. Examples of the clock gating cell 20 including the feedback transistor FT2 will be described below with reference to FIGS. 4A to 4D, 5A, and 5B.

FIGS. 4A to 4D are circuit diagrams showing examples of a clock gating cell according to example embodiments. The circuit diagrams of FIGS. 4A to 4D show examples of the clock gating cell 20 of FIG. 2. Hereinafter, in discussion of FIGS. 4A to 4D, repeated descriptions and descriptions identical to those given above with reference to FIGS. 2 and 3 will be omitted.

Figure 4A:
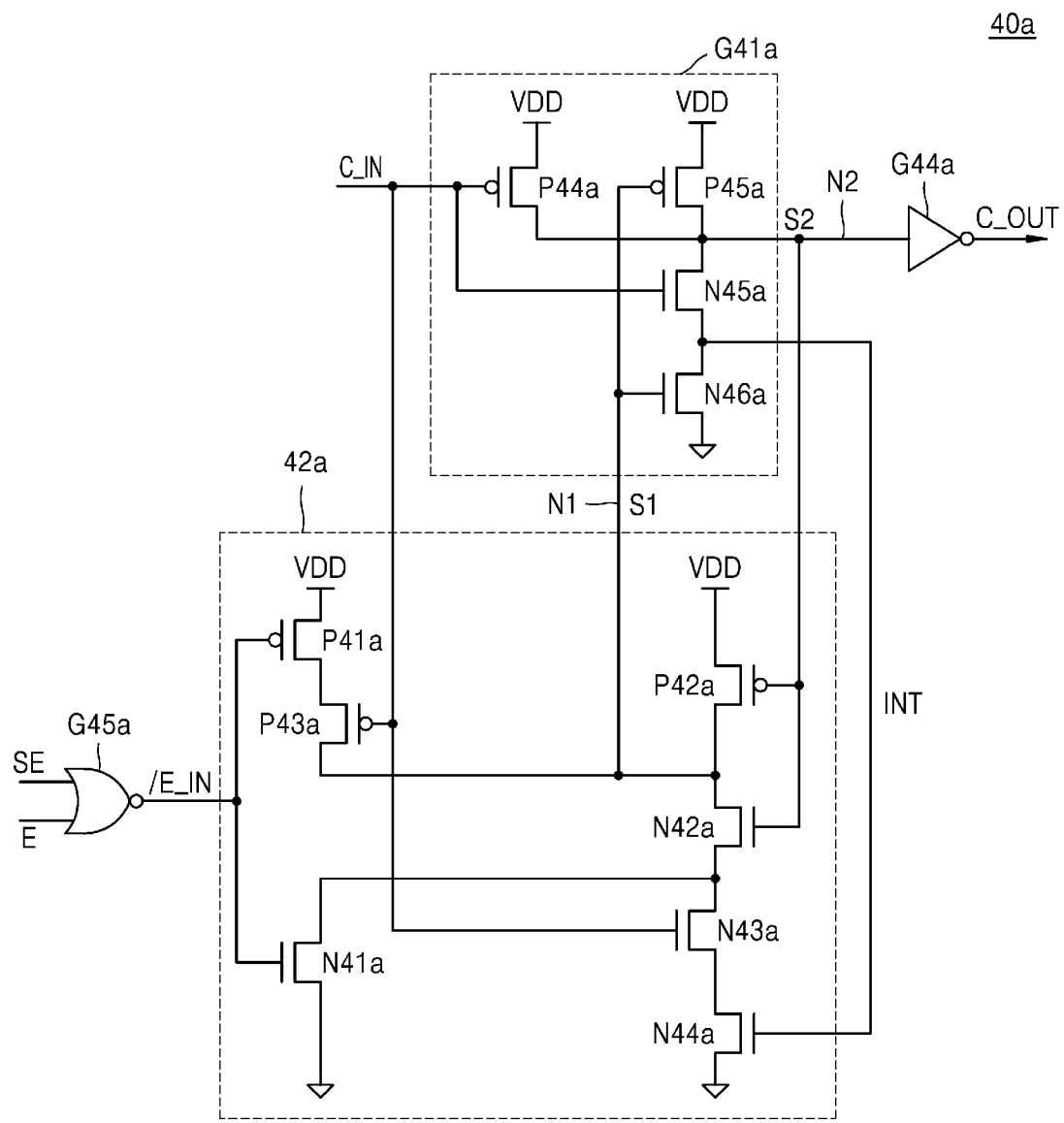
FIGS. 4A to 4D are circuit diagrams showing examples of a clock gating cell according to example embodiments.

Referring to FIG. 4A, a clock gating cell 40a may include a first NAND gate G41a, a 2-1 OAI gate 42a, an inverter G44a, and a NOR gate G45a. The 2-1 OAI gate 42a may include a first n-channel field effect transistor (NFET) N41a, a second NFET N42a, and a third NFET n43a for receiving the inverted enable input /E_IN, the second signal S2, and the clock input C_IN, respectively, and may further include a fourth NFET N44a for receiving the internal signal INT as a feedback transistor. As shown in FIG. 4A, the fourth NFET N44a may be connected in series to the third NFET N43a between the first node N1 at which the first signal S1 is generated and a ground node and exclusively receive the internal signal INT of the first NAND gate G41a. Also, the second NFET N42a may be connected in series to the third NFET N43a and the fourth NFET N44a between the first node N1 and the ground node. In the clock gating cell 40a of FIG. 4A, the second NFET N42a, the third NFET N43a, and the fourth NFET N44a may be sequentially connected to one another in series between the first node N1 and the ground node, and the first NFET N41a may have a drain connected to a source of the second NFET N42a and a drain of the third NFET N43a and may have a source connected to the ground node. As shown in FIG. 4A, the 2-1 OAI gate 42a may further include a first p-channel field effect transistor (PFET) P41a, a second PFET P42a, and a third PFET P43a for receiving the inverted enable input /E_IN, the second signal S2, and the clock input C_IN, respectively.

The series configuration of the second NFET N42a, the third NFET N43a, and the fourth NFET (or feedback transistor) N44a may be referred to as an NFET stack. Based on the internal signal INT, the NFET stack is configured to maintain the first signal S1 at a stable voltage level, the state of N46a is not changed by a race condition described above with reference to FIG. 3, and the second signal S2 is not caused to jitter by the race condition.

The first NAND gate G41a may include a fifth NFET N45a and a sixth NFET N46a for receiving the clock input C_IN and the first signal S1, respectively, and the fifth NFET N45a and sixth NFET N46a may be connected to each other in series between the second node N2 at which the second signal S2 is generated and the ground node. The internal signal INT may be generated at a node to which a source of the fifth NFET N45a and a drain of the sixth NFET N46a are connected. Therefore, while the first signal S1 may be logic '1', the internal signal INT may be logic '0' due to the sixth NFET N46a that is turned on, and thus, the fourth NFET N44a is turned off. Therefore, discharging (or pull-down) of the first node N1 may be prevented and a race condition may be avoided. As described above, the internal signal INT may be provided only to the fourth NFET N44a. As shown in FIG. 4A, the first NAND gate G41a may further include a fourth PFET P44a and a fifth PFET P45a for receiving the clock input C_IN and the first signal S1, respectively.

Figure 4B:
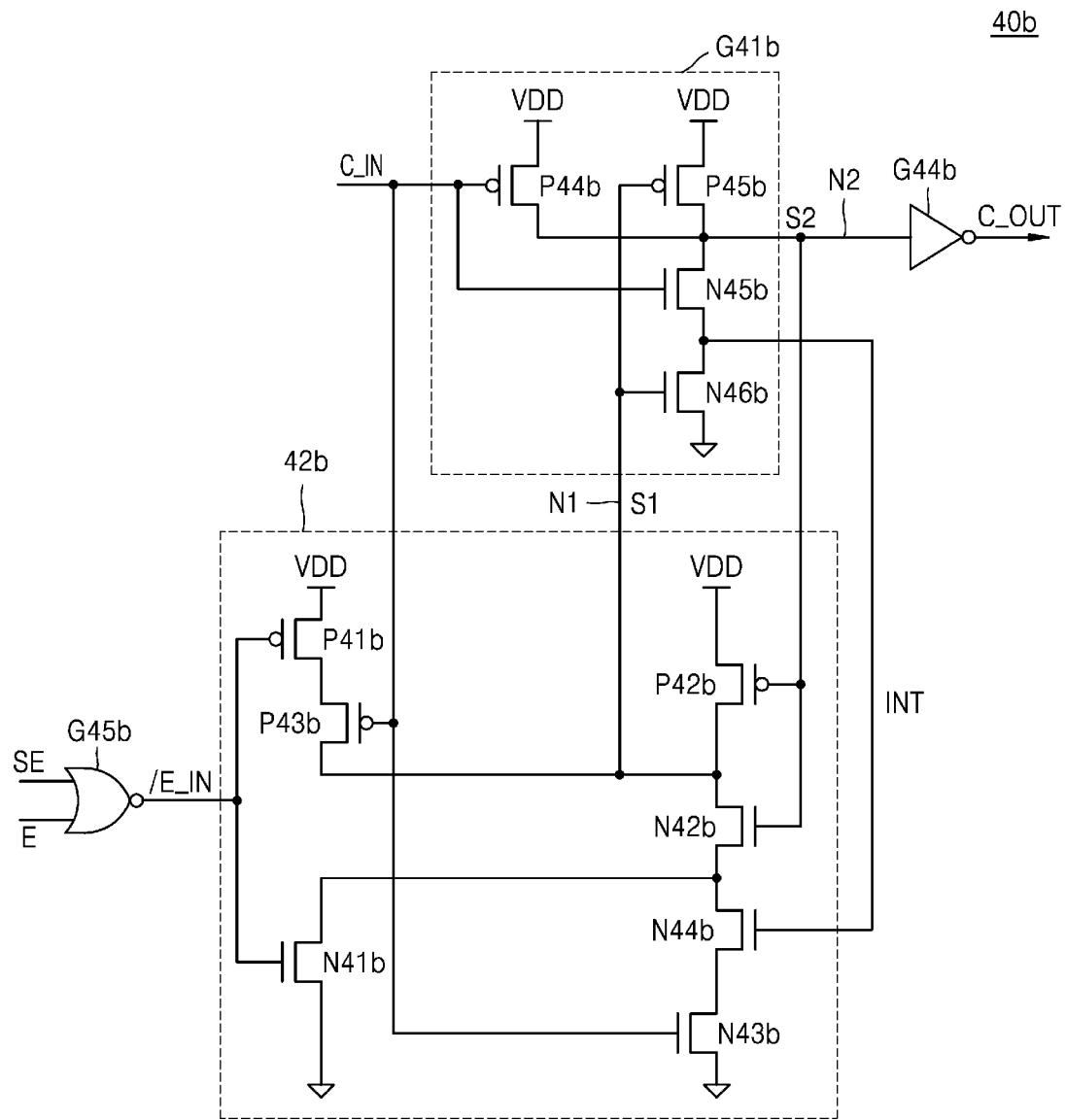

Referring to FIG. 4B, a clock gating cell 40b may include a first NAND gate G41b, a 2-1 OAI gate 42b, an inverter G44b, and a NOR gate G45b. The 2-1 OAI gate 42b may include a first NFET N41b, a second NFET N42b, a third NFET N43b, and a fourth NFET N44b for receiving the inverted enable input /E_IN, the second signal S2, the clock input C_IN, and the internal signal INT, respectively, and include a first PFET P41b, a second PFET P42b, and a third PFET P43b for receiving the inverted enable input /E_IN, the second signal S2, and the clock input C_IN, respectively. Also, the first NAND gate G41b may include a fifth NFET N45b and a sixth NFET N46b for receiving the clock input C_IN and the first signal S1, respectively, and include a fourth PFET P44b and a fifth PFET P45b for receiving the clock input C_IN and the first signal S1, respectively.

Compared with the 2-1 OAI gate 42a of FIG. 4A, the third NFET N43b and the fourth NFET N44b are differently arranged in the 2-1 OAI gate 42b of FIG. 4B. For example, as shown in FIG. 4B, the second NFET N42b, the fourth NFET N44b, and the third NFET N43b may be sequentially connected to one another in series between the first node N1 and the ground node, and the first NFET N41b may have a drain connected to a source of the second NFET N42b and a drain of the fourth NFET N44b and may have a source connected to the ground node. As described above with reference to FIG. 4A, the fourth NFET N44b is a feedback transistor controlled by the internal signal INT, and the feedback transistor is configured to prevent the discharging of the first node N1 in response to the internal signal INT, thus avoiding the race condition described with reference to FIG. 3.

Figure 4C:
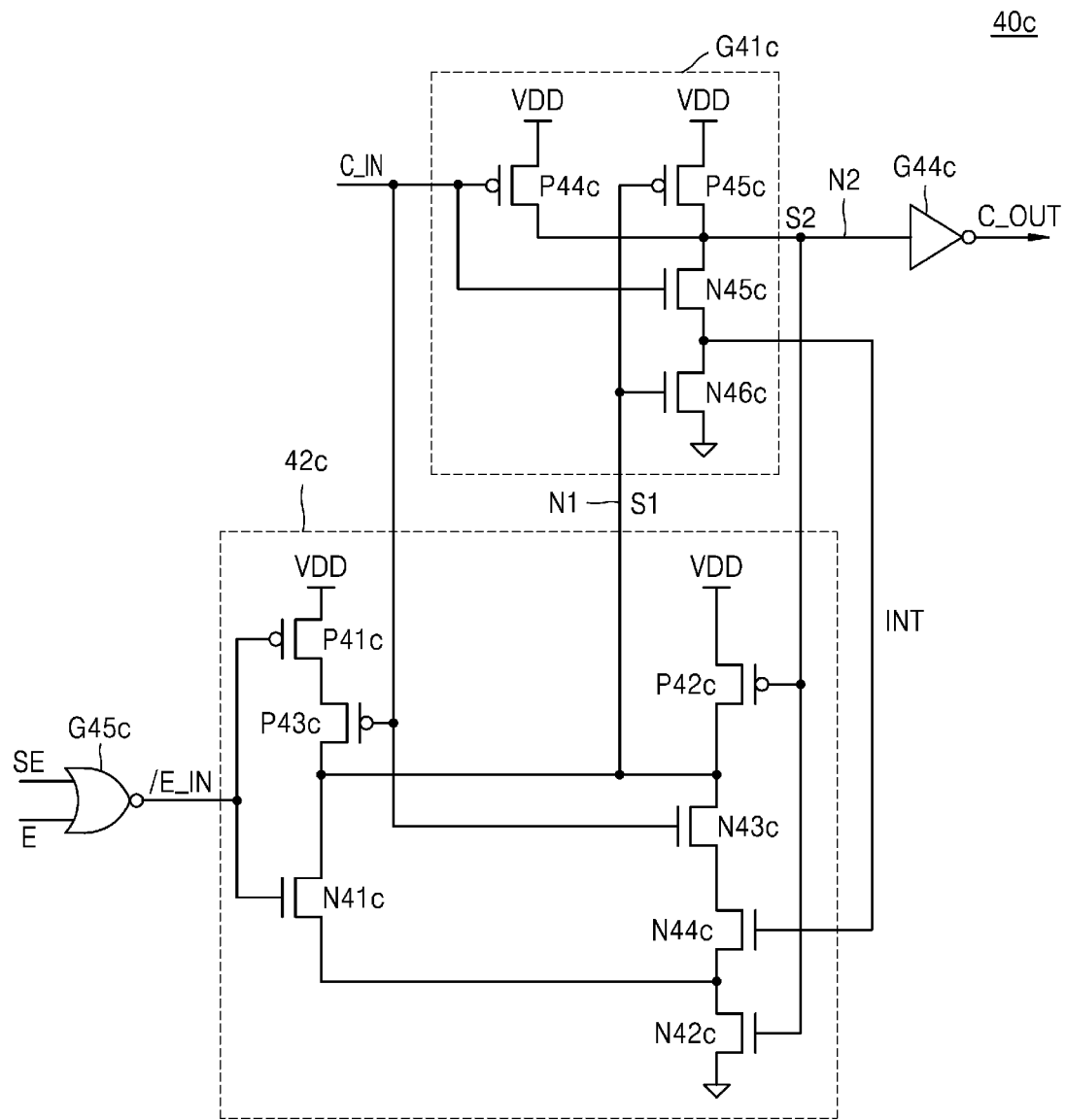

Referring to FIG. 4C, a clock gating cell 40c may include a first NAND gate G41c, a 2-1 OAI gate 42c, an inverter G44c, and a NOR gate G45c. The 2-1 OAI gate 42c may include a first NFET N41c, a second NFET N42c, a third NFET N43c, and a fourth NFET N44c for receiving the inverted enable input /E_IN, the second signal S2, the clock input C_IN, and the internal signal INT, respectively, and include a first PFET P41c, a second PFET P42c, and a third PFET P43c for receiving the inverted enable input /E_IN, the second signal S2, and the clock input C_IN, respectively. Also, the first NAND gate G41c may include a fifth NFET N45c and a sixth NFET N46c for receiving the clock input C_IN and the first signal S1, respectively, and include a fourth PFET P44c and a fifth PFET P45c for receiving the clock input C_IN and the first signal S1, respectively.

Compared with the 2-1 OAI gate 42a of FIG. 4A, the first NFET N41c, the second NFET N42c, the third NFET N43c, and the fourth NFET N44c are differently arranged in the 2-1 OAI gate 42c of FIG. 4C. For example, as shown in FIG. 4C, the third NFET N43c, the fourth NFET N44c, and the second NFET N42c may be sequentially connected to one another in series between the first node N1 and the ground node, and the first NFET N41c may have a drain connected to the first node N1 (i.e., a drain of the third NFET N43c) and may have a source connected to a source of the fourth NFET N44c and a drain of the second NFET N42c. As described above with reference to FIG. 4A, the fourth NFET N44c is a feedback transistor controlled by the internal signal INT. The feedback transistor is configured to avoid the race condition by preventing the discharging of the first node N1.

Figure 4D:
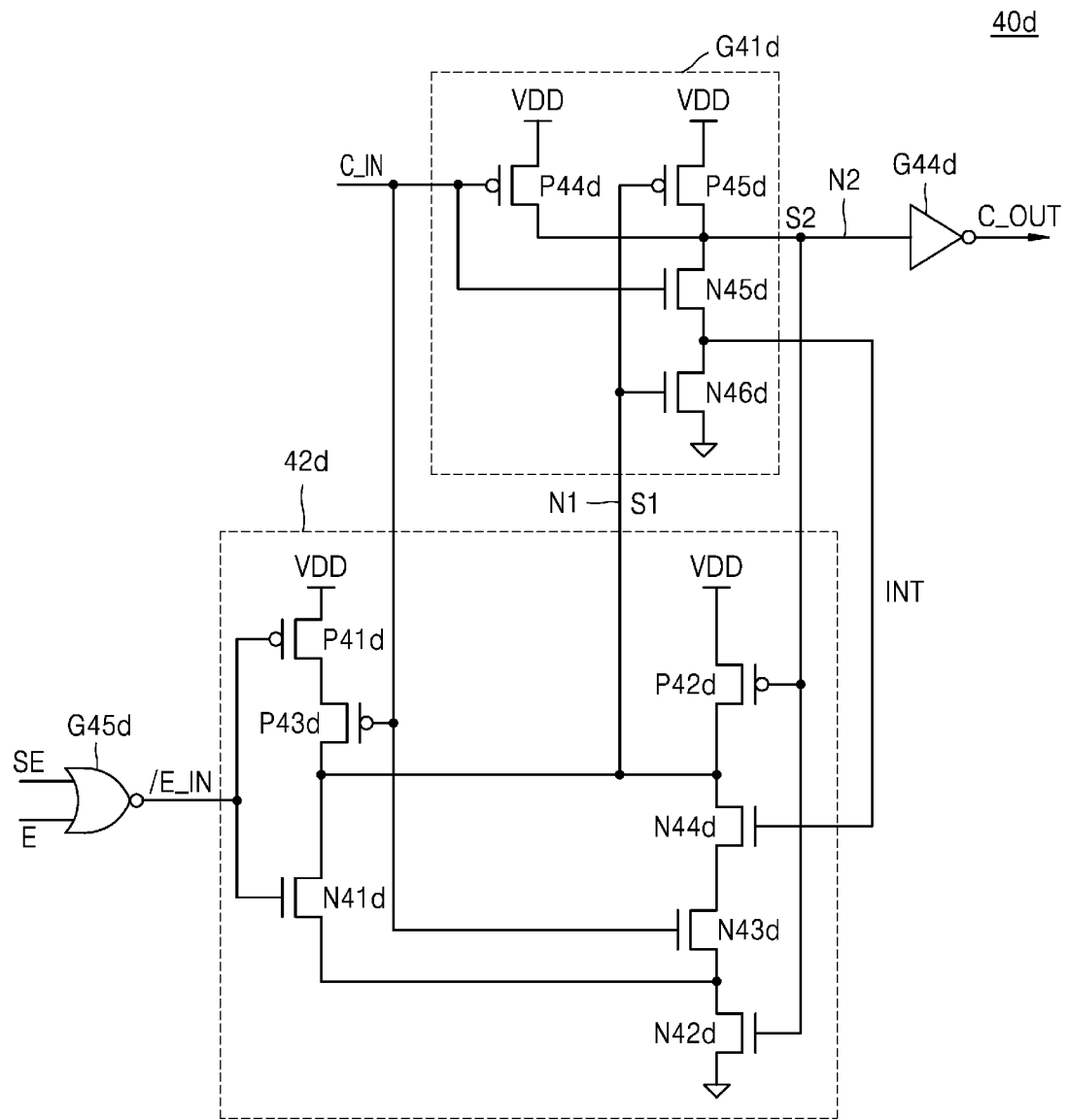

Referring to FIG. 4D, a clock gating cell 40d may include a first NAND gate G41d, a 2-1 OAI gate 42d, an inverter G44d, and a NOR gate G45d. The 2-1 OAI gate 42d may include a first NFET N41d, a second NFET N42d, a third NFET N43d, and a fourth NFET N44d for receiving the inverted enable input /E_IN, the second signal S2, the clock input C_IN, and the internal signal INT, respectively, and include a first PFET P41d, a second PFET P42d, and a third PFET P43d for receiving the inverted enable input /E_IN, the second signal S2, and the clock input C_IN, respectively. Also, the first NAND gate G41d may include a fifth NFET N45d and a sixth NFET N46d for receiving the clock input C_IN and the first signal S1, respectively, and include a fourth PFET P44d and a fifth PFET P45d for receiving the clock input C_IN and the first signal S1, respectively.

Compared with the 2-1 OAI gate 42c of FIG. 4C, the third NFET N43d and the fourth NFET N44d may be differently arranged in the 2-1 OAI gate 42d of FIG. 4D. For example, as shown in FIG. 4D, the fourth NFET N44d, the third NFET N43d, and the second NFET N42d may be sequentially connected to one another in series between the first node N1 and the ground node, and the first NFET N41d may have a drain connected to the first node N1 (i.e., a drain of the fourth NFET N44d) and may have a source connected to a source of the third NFET N43d and a drain of the second NFET N42d. As described above with reference to FIG. 4A, the fourth NFET N44d is a feedback transistor controlled by the internal signal INT. The feedback transistor is configured to avoid the race condition by preventing the discharging of the first node N1.

Figure 5A:
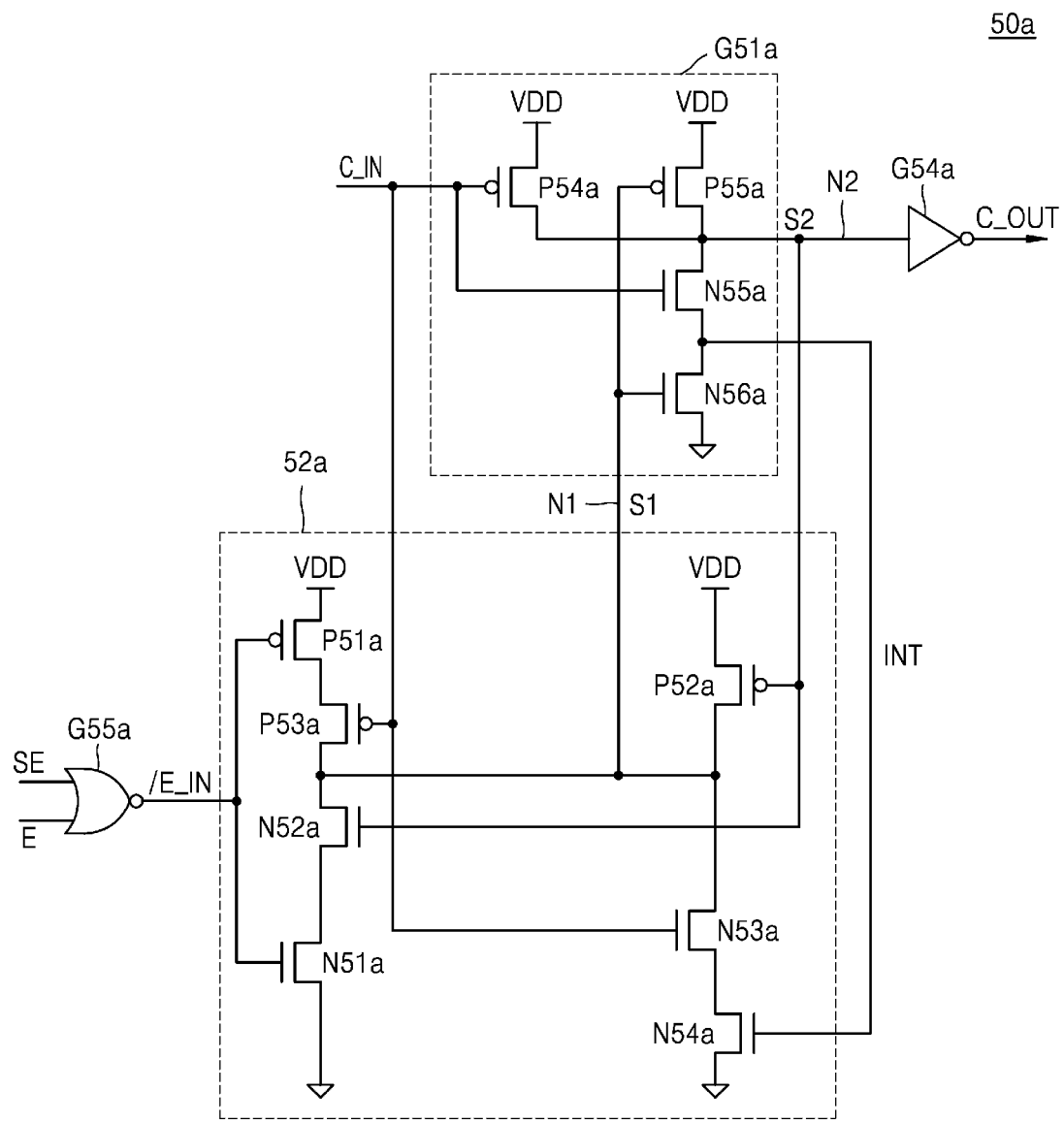
FIGS. 5A and 5B are circuit diagrams showing examples of a clock gating cell according to example embodiments.
Figure 5B:
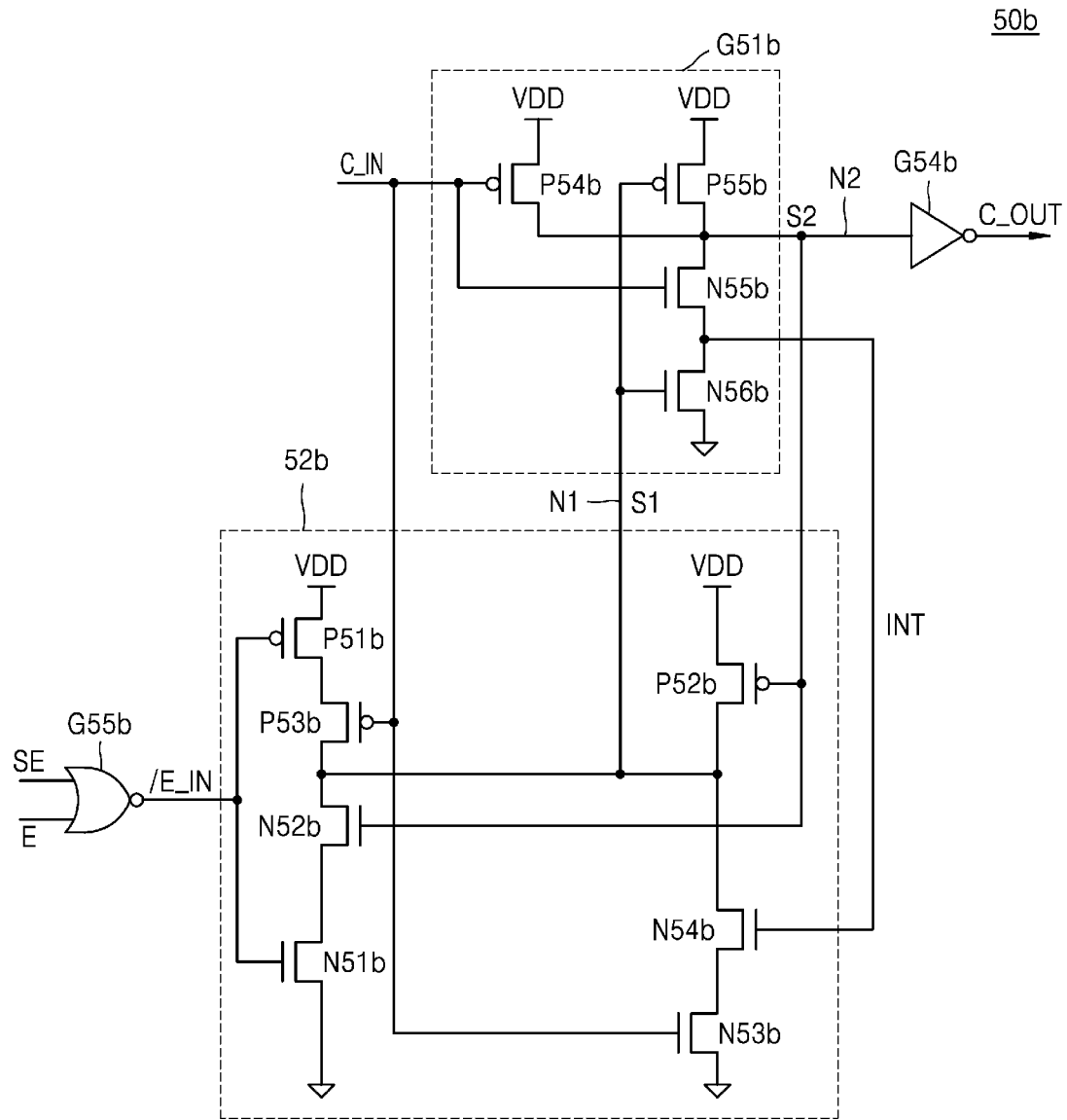

FIGS. 5A and 5B are circuit diagrams showing examples of a clock gating cell according to example embodiments. In detail, the circuit diagrams of FIGS. 5A and 5B show examples of the clock gating cell 20 of FIG. 2, respectively. As described above, in the clock gating cells 40a to 40d of FIGS. 4A to 4D, a second NFET, a third NFET, and a fourth NFET (e.g., the second NFET N42a, the third NFET N43a, and the fourth NFET N44a of FIG. 4A) for receiving the second signal S2, the clock input C_IN, and the internal signal INT, respectively, may be connected to one another in series between the first node N1 and the ground node, whereas, in clock gating cells 50a and 50b of FIGS. 5A and 5B, a second NFET (e.g., a second NFET N52a of FIG. 5A) for receiving the second signal S2 may not be connected in series to a third NFET and a fourth NFET (e.g., a third NFET N53a and a fourth NFET N54a of FIG. 5A) for receiving the clock input C_IN and the internal signal INT, respectively, between the first node N1 and the ground node. Hereinafter, from among descriptions of FIGS. 5A and 5B, repeated descriptions and descriptions identical to those given above with reference to FIGS. 4A to 4D will be omitted.

Referring to FIG. 5A, a clock gating cell 50a may include a first NAND gate G51a, a 2-1 OAI gate 52a, an inverter G54a, and a NOR gate G55a. The 2-1 OAI gate 52a may include a first NFET N51a, a second NFET N52a, a third NFET N53a, and a fourth NFET N54a for receiving the inverted enable input /E_IN, the second signal S2, the clock input C_IN, and the internal signal INT, respectively, and include a first PFET P51a, a second PFET P52a, and a third PFET P53a for receiving the inverted enable input /E_IN, the second signal S2, and the clock input C_IN, respectively. Also, the first NAND gate G51a may include a fifth NFET N55a and a sixth NFET N56a for receiving the clock input C_IN and the first signal S1, respectively, and include a fourth PFET P54a and a fifth PFET P55a for receiving the clock input C_IN and the first signal S1, respectively.

As shown in FIG. 5A, the second NFET N52a and the first NFET N51a may be connected to each other in series between the first node N1 and the ground node. For example, the first NFET N51a may have a drain connected to a source of the second NFET N52a and may have a source connected to the ground node, and the second NFET N52a may have a drain connected to the first node N1 and may have a source connected to a drain of the first NFET N51a. Also, the third NFET N53a and the fourth NFET N54a may be sequentially connected to each other in series between the first node N1 and the ground node. The fourth NFET N54a is a feedback transistor controlled by the internal signal INT. The feedback transistor is configured to avoid the race condition by preventing the discharging of the first node N1.

Referring to FIG. 5B, a clock gating cell 50b may include a first NAND gate G51b, a 2-1 OAI gate 52b, an inverter G54b, and a NOR gate G55b. The 2-1 OAI gate 52b may include a first NFET N51b, a second NFET N52b, a third NFET N53b, and a fourth NFET N54b for receiving the inverted enable input /E_IN, the second signal S2, the clock input C_IN, and the internal signal INT, respectively, and include a first PFET P51b, a second PFET P52b, and a third PFET P53b for receiving the inverted enable input /E_IN, the second signal S2, and the clock input C_IN, respectively. Also, the first NAND gate G51b may include a fifth NFET N55b and a sixth NFET N56b for receiving the clock input C_IN and the first signal S1, respectively, and include a fourth PFET P54b and a fifth PFET P55b for receiving the clock input C_IN and the first signal S1, respectively.

Compared with the 2-1 OAI gate 52a of FIG. 5A, the third NFET N53b and the fourth NFET N54b may be differently arranged in the 2-1 OAI gate 52b of FIG. 5B. For example, as shown in FIG. 5B, the fourth NFET N54b and the third NFET N53b may be sequentially connected to one another in series between the first node N1 and the ground node, and the second NFET N52b may have a drain connected to the first node N1 (i.e., a drain of the fourth NFET N54b). The fourth NFET N54b is a feedback transistor controlled by the internal signal INT. The feedback transistor is configured to avoid the race condition by preventing the discharging of the first node N1.

Figure 6:
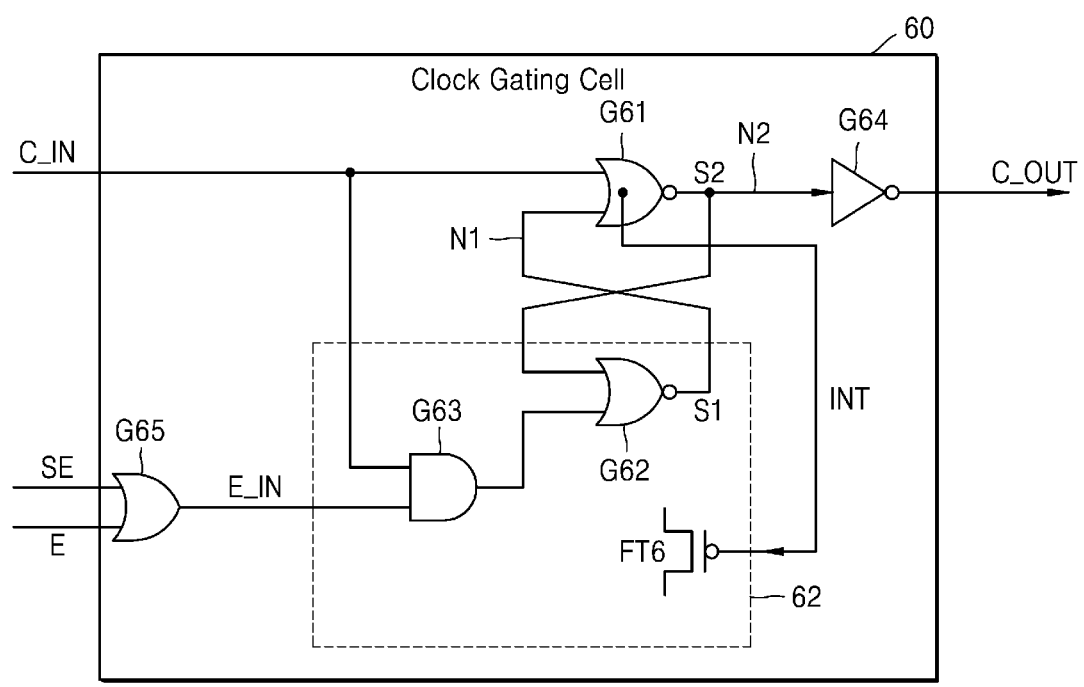
FIG. 6 is a block diagram showing an example of a clock gating cell according to an example embodiment.
Figure 7:
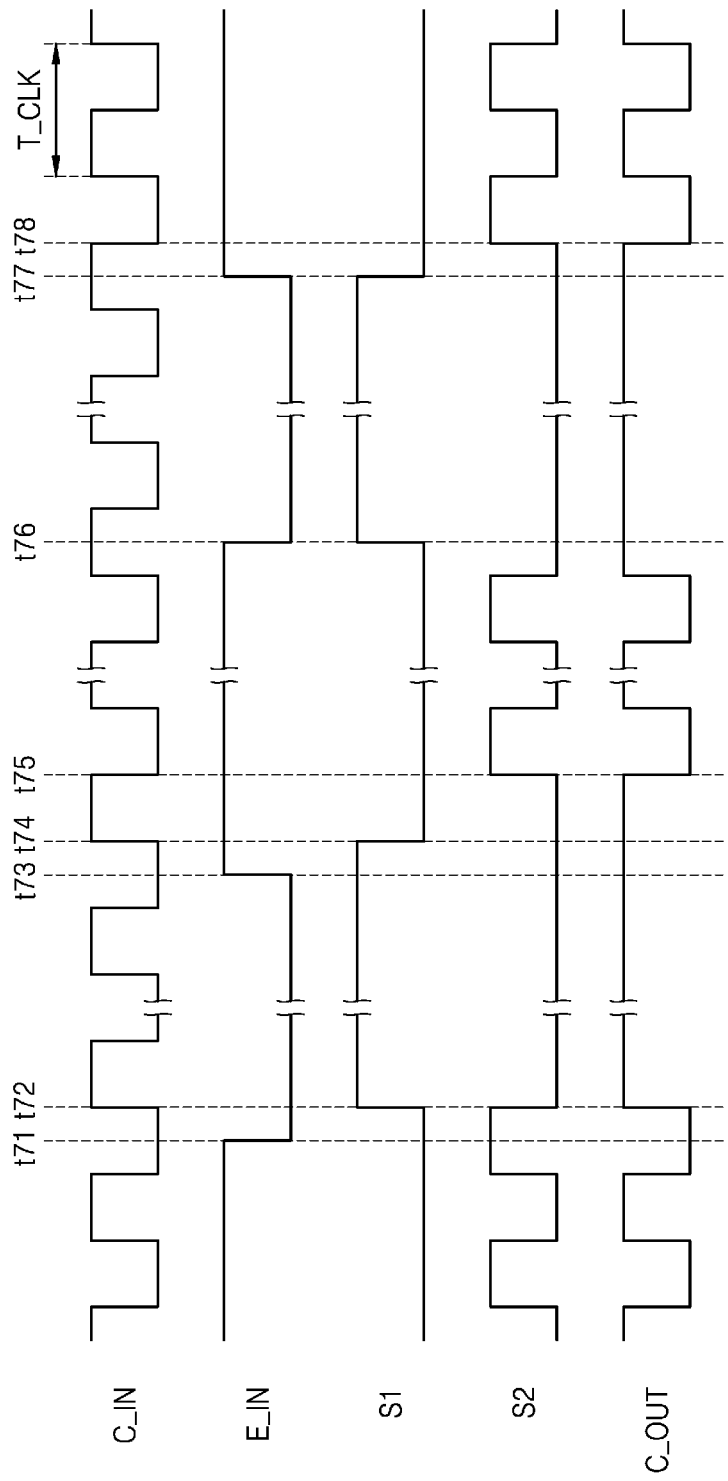
FIG. 7 is a timing diagram showing an example of the operation of a clock gating cell according to an example embodiment.

FIG. 6 is a block diagram showing an example of a clock gating cell according to an example embodiment, and FIG. 7 is a timing diagram showing an example of an operation of a clock gating cell according to an example embodiment. In detail, the block diagram of FIG. 6 shows a clock gating cell 60 that generates the clock output C_OUT that is logic '1' in the disabled state as an example of the clock gating cell 10 of FIG. 1, and the timing diagram of FIG. 7 shows signals according to the lapse of time in the clock gating cell 60 of FIG. 6. For convenience of illustration, propagation delay may be ignored in the timing diagram of FIG. 7, and descriptions identical to those given above with reference to FIG. 1 will be omitted.

Referring to FIG. 6, the clock gating cell 60 may include a first NOR gate G61, a 2-1 AOI gate 62, and an inverter G64, similar to the clock gating cell 10 of FIG. 1, and may further include an OR gate G65. The OR gate G65 may receive the clock enable E and the test enable SE, generate an enable input E_IN, and provide the enable input E_IN to the 2-1 AOI gate 62. In some embodiments, unlike as shown in FIG. 6, the OR gate G65 may be omitted, and thus, the clock gating cell 60 may directly receive the enable input E_IN from the outside. Furthermore, in some embodiments, as described below with reference to FIGS. 8E and 9C, the OR gate G65 may be coupled to the 2-1 AOI gate 62 by sharing at least one transistor with the 2-1 AOI gate 62.

The first NOR gate G61 may form an SR latch (or an SR NOR latch) together with a second NOR gate G62 provided by the 2-1 AOI gate 62. For example, as shown in FIG. 6, the first NOR gate G61 and the second NOR gate G62 may be cross-coupled through the first node N1 and a second node N2. The first NOR gate G61 may generate the second signal S2 dependent on the clock input C_IN when the first signal S1 is logic '0' and may generate the second signal S2 regardless of the clock input C_IN when the first signal S1 is logic '1'. The 2-1 AOI gate 62 may generate the first signal S1 by performing a logical operation on the enable input E_IN, the clock input C_IN, and the second signal S2 according to the second NOR gate G62 and an AND gate G63.

Referring to FIG. 7, the clock input C_IN may oscillate at a period T_CLK. Before a time point t71, the clock enable E and/or the test enable SE may be logic '1'. Therefore, the enable input E_IN may be logic '1', and the clock gating cell 60 may be in the enabled state. Due to the second NOR gate G62, the first signal S1 may be logic '0' and the second signal S2 may be identical to the inverted version of the clock input C_IN, and thus, the clock output C_OUT may be identical to the clock input C_IN (e.g., a delayed version of the clock input C_IN).

At the time point t71, the clock enable E and the test enable SE may be transited to logic '0'. Therefore, the enable input E_IN may be transited to logic '0', and the clock gating cell 60 may enter the disabled state. Since the clock input C_IN is logic '0', the first signal S1 may be maintained at logic '0', and the second signal S2 and the clock output C_OUT may also be maintained at logic '1' and logic '0', respectively. Next, at a time point t72, a rising edge of the clock input C_IN may occur, and thus, the second signal S2 and the clock output C_OUT may be transited to logic '0' and logic '1' by the first NOR gate G61, respectively. Also, the first signal S1 may be transited to logic '1' by the second NOR gate G62, and thus, due to the first NOR gate G61, the second signal S2 may maintain logic '0' regardless of the clock input C_IN. As a result, the clock output C_OUT may maintain logic '1' while the clock gating cell 60 is in the disabled state.

At a time point t73, the clock enable E and the test enable SE may be transited to logic '1'. Therefore, the enable input E_IN may be transited to logic '1', and the clock gating cell 60 may enter the enabled state. Since the clock input C_IN and the second signal S2 are logic '0', first signal S1 may maintain logic '1', and thus, the second signal S2 and the clock output C_OUT may also maintain logic '0' and logic '1', respectively. Next, at a time point t74, a rising edge of the clock input C_IN may occur, and thus, the first signal S1 may be transited to logic '0' by the second NOR gate G62. However, since the clock input C_IN is logic 1', the second signal S2 and the clock output C_OUT may maintain logic '0' and logic '1', respectively. Next, at a time point t75, a falling edge of clock input C_IN may occur, and, since the first signal S1 is logic '0', the second signal S2 and clock output C_OUT may be transited to logic '1' and logic '0', respectively.

At a time point t76, the clock enable E and the test enable SE may be transited to logic '0'. Therefore, the enable input E_IN may be transited to logic '0', and the clock gating cell 60 may enter the disabled state. Since the first signal S1 may be transited to logic '1' by the AND gate G63 and the second NOR gate G62 and the clock input C_IN is logic '1', the second signal S2 and the clock output C_OUT may maintain logic '0' and logic '1', respectively.

At a time point t77, the clock enable E and/or the test enable SE may be transited to logic F. Therefore, the enable input E_IN may be transited to logic 1', and the clock gating cell 60 may enter the enabled state. Although the first signal S1 may be transited to logic '0' by the AND gate G63 and the second NOR gate G62, the clock input C_IN is logic '1', and thus, the second signal S2 and the clock input C_IN may maintain logic '0' and logic '1', respectively. Next, at a time point t78, the falling edge of clock input C_IN may occur, and the second signal S2 and the clock output C_OUT may be transited to logic '1' and logic '0', respectively.

As described above, the clock output C_OUT may be maintained at logic '1' following the rising edge synchronized with the clock input C_IN when the clock gating cell 60 enters the disabled state. When the clock gating cell 60 enters the enabled state, the clock output C_OUT may oscillate following the falling edge synchronized with the clock input C_IN. Therefore, the clock gating cell 60 may provide the clock output C_OUT to a digital circuit that operates in response to the falling edge of the clock output C_OUT, e.g., a negative edge triggered flip-flop, and prevent a malfunction due to clock gating in the digital circuit.

Referring back to FIG. 6, the 2-1 AOI gate 62 may include a feedback transistor FT6 exclusively receiving the internal signal INT of the first NOR gate G61 to avoid a race condition. For example, when the falling edge of the clock input C_IN occurs in the enabled state of the clock gating cell 60, based on factors including a slew rate of the falling edge and a gate delay difference between the first NOR gate G61 and the AND gate G63, the falling edge of a signal output by the AND gate G63 may occur earlier than the rising edge of the second signal S2 or may occur near the rising edge of the second signal S2. Therefore, the voltage level of the first signal S1 that needs to be maintained at logic '0' may be unstable, and, as a result, an error may occur in the clock output C_OUT. The feedback transistor FT6 may avoid such a race condition by preventing the pull-up (or charging) of the first node N1. Examples of the clock gating cell 60 including a feedback transistor FT62 will be described below with reference to FIGS. 8A to 8E and 9A to 9C.

FIGS. 8A to 8E are circuit diagrams showing examples of a clock gating cell according to example embodiments. In detail, the circuit diagrams of FIGS. 8A to 8E show examples of the clock gating cell 60 of FIG. 6. Hereinafter, when describing FIGS. 8A to 8E, description redundant to that given above with reference to FIGS. 6 and 7 will be omitted.

Figure 8A:
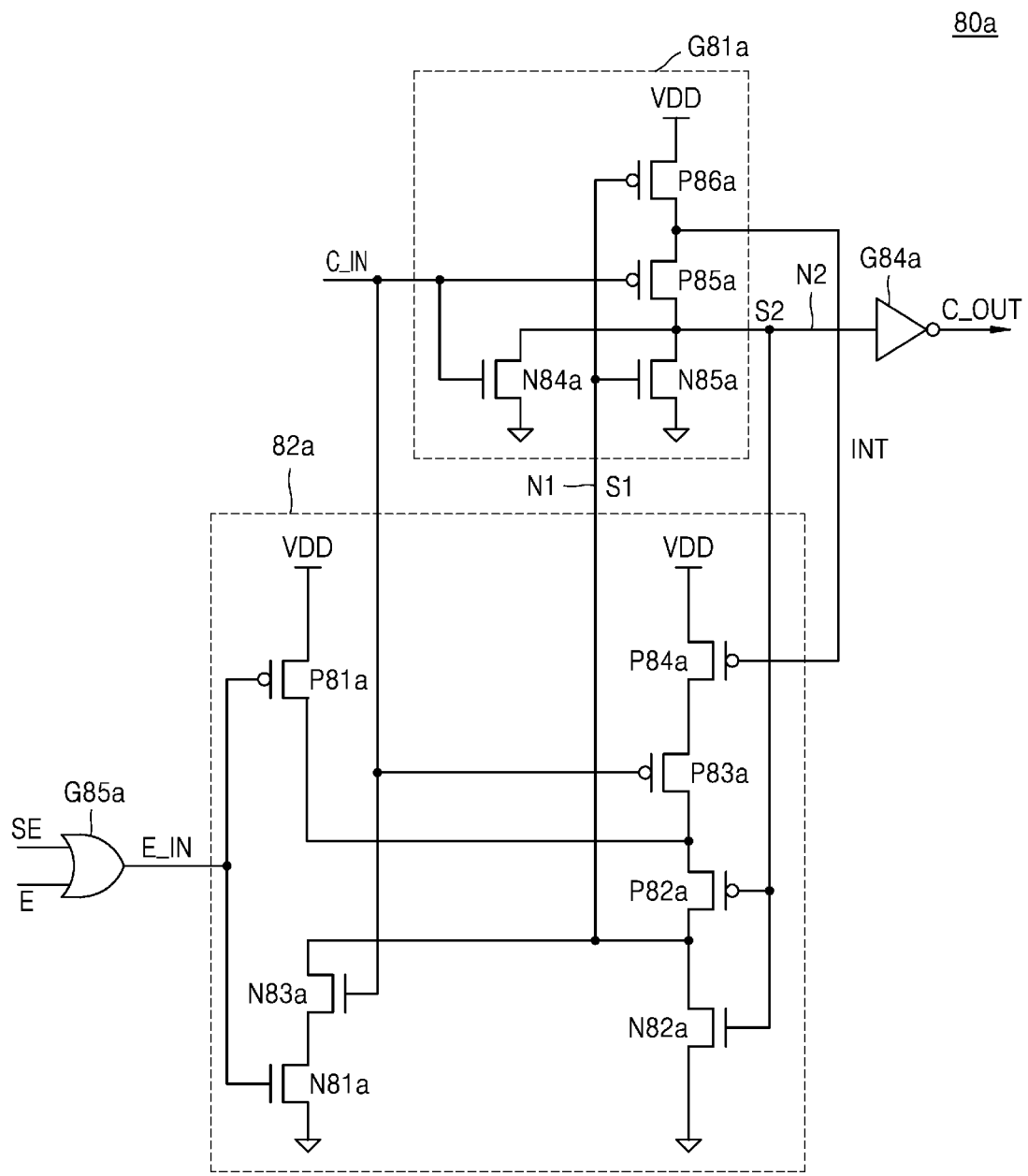
FIGS. 8A to 8E are circuit diagrams showing examples of a clock gating cell according to example embodiments.

Referring to FIG. 8A, a clock gating cell 80a may include a first NOR gate G81a, a 2-1 AOI gate 82a, an inverter G84a, and an OR gate G85a. The 2-1 AOI gate 82a may include a first PFET P81a, a second PFET P82a, and a third PFET P83a for receiving the enable input E_IN, the second signal S2, and the clock input C_IN, respectively, and may further include a fourth PFET P84a for receiving the internal signal INT as a feedback transistor. As shown in FIG. 8A, the fourth PFET P84a may be connected in series to the third PFET P83a between the first node N1 at which the first signal S1 is generated and a positive power supply node and exclusively receive the internal signal INT of the first NOR gate G81a. Also, the second PFET P82a may be connected in series to the third PFET P83a and the fourth PFET P84a between the first node N1 and the positive power supply node. In the clock gating cell 80a of FIG. 8A, the second PFET P82a, the third PFET P83a, and the fourth PFET P84a may be sequentially connected to one another in series between the first node N1 and the positive power supply node, and the first PFET P81a may have a drain connected to a source of the second PFET P82a and a drain of the third PFET P83a and may have a source connected to the positive power supply node. As shown in FIG. 8A, the 2-1 AOI gate 82a may further include a first NFET N81a, a second NFET N82a, and a third NFET N83a for receiving the enable input E_IN, the second signal S2, and the clock input C_IN, respectively.

The first NOR gate G81a may include a fifth PFET P85a and a sixth PFET P86a for receiving the clock input C_IN and the first signal S1, respectively, and the fifth PFET P85a and sixth PFET P86a may be connected to each other in series between the second node N2 at which the second signal S2 is generated and the positive power supply node. The internal signal INT may be generated at a node to which a source of the fifth PFET P85a and a drain of the sixth PFET P86a are connected. Therefore, while the first signal S1 may be logic '0', the internal signal INT may be logic '0' due to the sixth PFET P86a that is turned off, and thus, the fourth PFET P84a is turned off. Therefore, charging (or pull-up) of the first node N1 may be prevented and a race condition described with reference to FIG. 7 is be avoided. As described above, the internal signal INT may be provided only to the fourth PFET P84a. As shown in FIG. 8A, the first NOR gate G81a may further include a fourth NFET N84a and a fifth NFET N85a for receiving the clock input C_IN and the first signal S1, respectively.

Figure 8B:
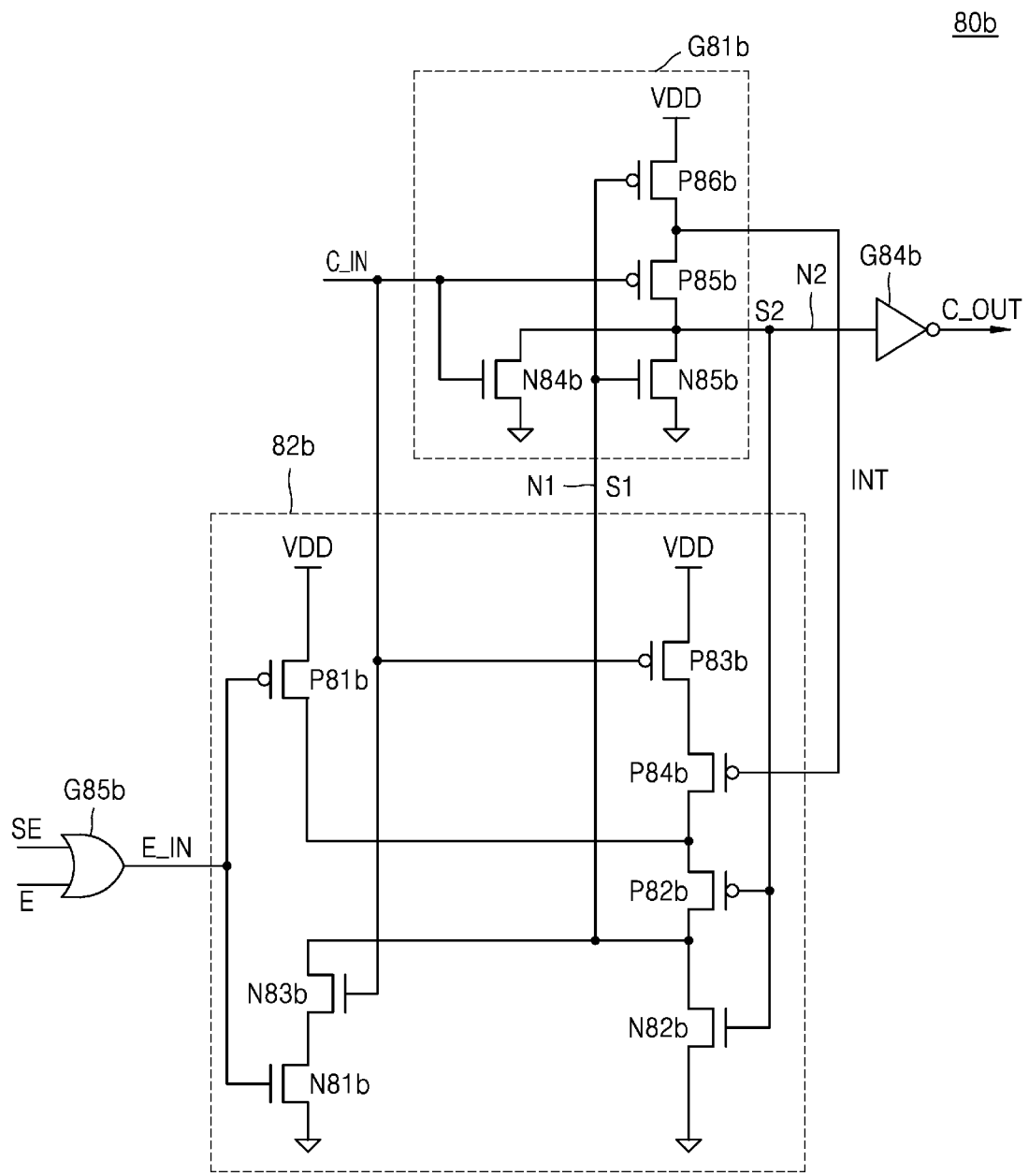

Referring to FIG. 8B, a clock gating cell 80b may include a first NOR gate G81b, a 2-1 AOI gate 82b, an inverter G84b, and an OR gate G85b. The 2-1 OAI gate 82b may include a first PFET P81b, a second PFET P82b, a third PFET P83b, and a fourth PFET P84b for receiving the enable input E_IN, the second signal S2, the clock input C_IN, and the internal signal INT, respectively, and include a first NFET N81b, a second NFET N82b, and a third NFET N83b for receiving the enable input E_IN, the second signal S2, and the clock input C_IN, respectively. Also, the first NOR gate G81b may include a fifth PFET P85b and a sixth PFET P86b for receiving the clock input C_IN and the first signal S1, respectively, and include a fourth NFET N84b and a fifth NFET N85b for receiving the clock input C_IN and the first signal S1, respectively.

Compared with the 2-1 AOI gate 82a of FIG. 8A, the third PFET P83b and the fourth PFET P84b may be differently arranged in the 2-1 OAI gate 82b of FIG. 8B. For example, as shown in FIG. 8B, the second PFET P82b, the fourth PFET P84b, and the third PFET P83b may be sequentially connected to one another in series between the first node N1 and the positive power supply node, and the first PFET P81b may have a drain connected to a source of the second PFET P82b and a drain of the fourth PFET P84b and may have a source connected to the positive power supply node. As described above with reference to FIG. 8A, the fourth PFET P84b is a feedback transistor and may prevent the charging of the first node N1 in response to the internal signal INT. Thus, the race condition described with reference to FIG. 7 is avoided.

Figure 8C:
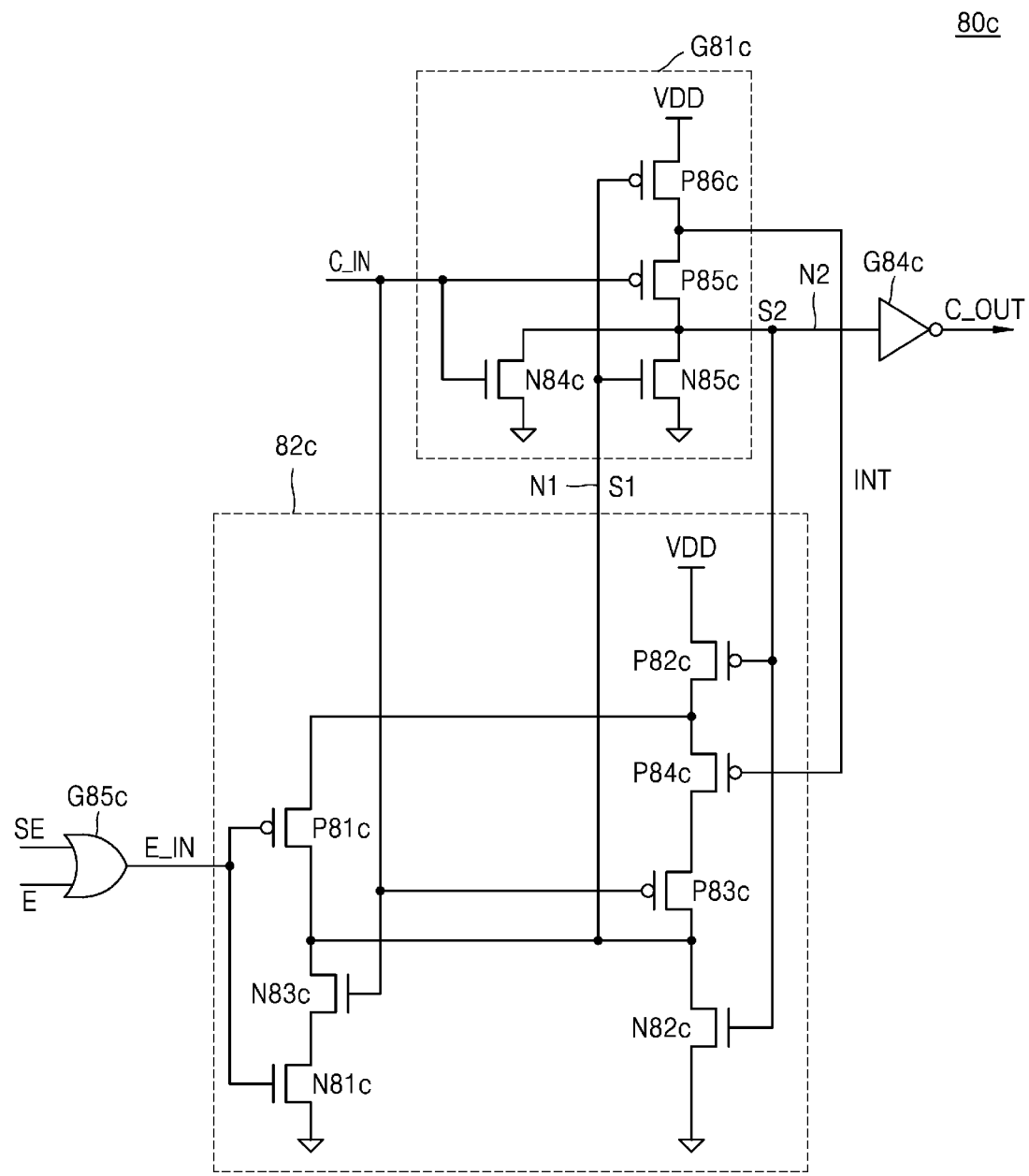

Referring to FIG. 8C, a clock gating cell 80c may include a first NOR gate G81c, a 2-1 AOI gate 82c, an inverter G84c, and an OR gate G85c. The 2-1 AOI gate 82c may include a first PFET P81c, a second PFET P82c, a third PFET P83c, and a fourth PFET P84c for receiving the enable input E_IN, the second signal S2, the clock input C_IN, and the internal signal INT, respectively, and include a first NFET N81c, a second NFET N82c, and a third NFET N83c for receiving the enable input E_IN, the second signal S2, and the clock input C_IN, respectively. Also, the first NOR gate G81c may include a fifth PFET P85c and a sixth PFET P86c for receiving the clock input C_IN and the first signal S1, respectively, and include a fourth NFET N84c and a fifth NFET N85c for receiving the clock input C_IN and the first signal S1, respectively.

Compared with the 2-1 AOI gate 82a of FIG. 8A, the first PFET P81c, the second PFET P82c, the third PFET P83c, and the fourth PFET P84c may be differently arranged in the 2-1 AOI gate 82c of FIG. 8C. For example, as shown in FIG. 8C, the third PFET P83c, the fourth PFET P84c, and the second PFET P82c may be sequentially connected to one another in series between the first node N1 and the positive power supply node, and the first PFET P81c may have a drain connected to the first node N1 (i.e., a drain of the third PFET P83c) and may have a source connected to a source of the fourth PFET P84c and a drain of the second PFET P82c. As described above with reference to FIG. 8A, the fourth PFET P84c is a feedback transistor and may prevent the charging of the first node N1 in response to the internal signal INT. Thus, the race condition described with reference to FIG. 7 is avoided.

Figure 8D:
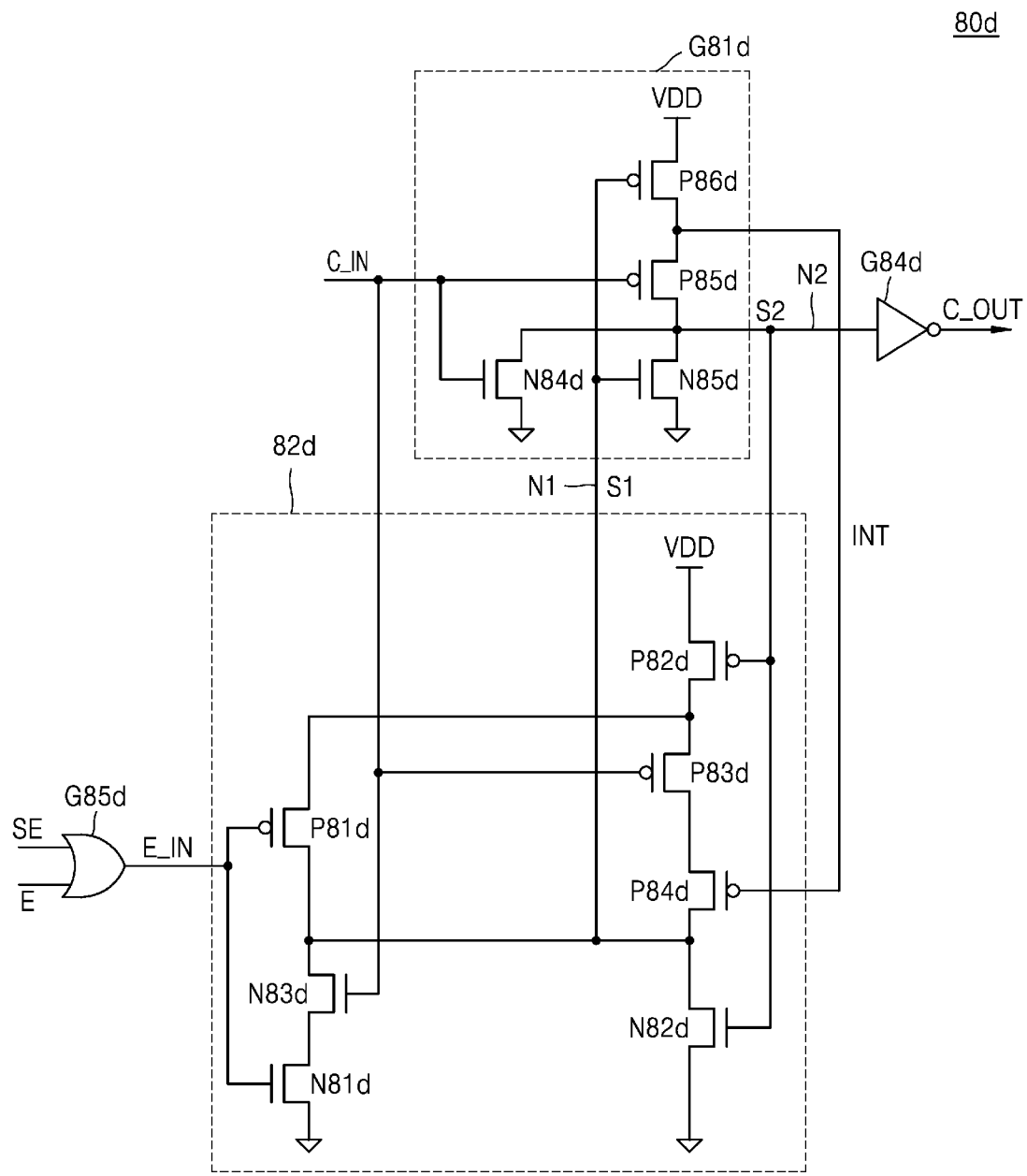

Referring to FIG. 8D, a clock gating cell 80d may include a first NOR gate G81d, a 2-1 AOI gate 82d, an inverter G84d, and an OR gate G85d. The 2-1 OAI gate 82d may include a first PFET P81d, a second PFET P82d, a third PFET P83d, and a fourth PFET P84d for receiving the enable input E_IN, the second signal S2, the clock input C_IN, and the internal signal INT, respectively, and include a first NFET N81d, a second NFET N82d, and a third NFET N83d for receiving the enable input E_IN, the second signal S2, and the clock input C_IN, respectively. Also, the first NOR gate G81d may include a fifth PFET P85d and a sixth PFET P86d for receiving the clock input C_IN and the first signal S1, respectively, and include a fourth NFET N84d and a fifth NFET N85d for receiving the clock input C_IN and the first signal S1, respectively.

Compared with the 2-1 AOI gate 82c of FIG. 8C, the third PFET P83d and the fourth PFET P84d may be differently arranged in the 2-1 AOI gate 82d of FIG. 8D. For example, as shown in FIG. 8D, the fourth PFET P84d, the third PFET P83d, and the second PFET P82d may be sequentially connected to one another in series between the first node N1 and the positive power supply node, and the first PFET P81d may have a drain connected to the first node N1 (i.e., a drain of the fourth PFET P84d) and may have a source connected to a source of the third PFET P83d and a drain of the second PFET P82d. As described above with reference to FIG. 8A, the fourth PFET P84d is a feedback transistor and may prevent the charging of the first node N1 in response to the internal signal INT. Thus, the race condition described with reference to FIG. 7 is avoided.

Figure 8E:
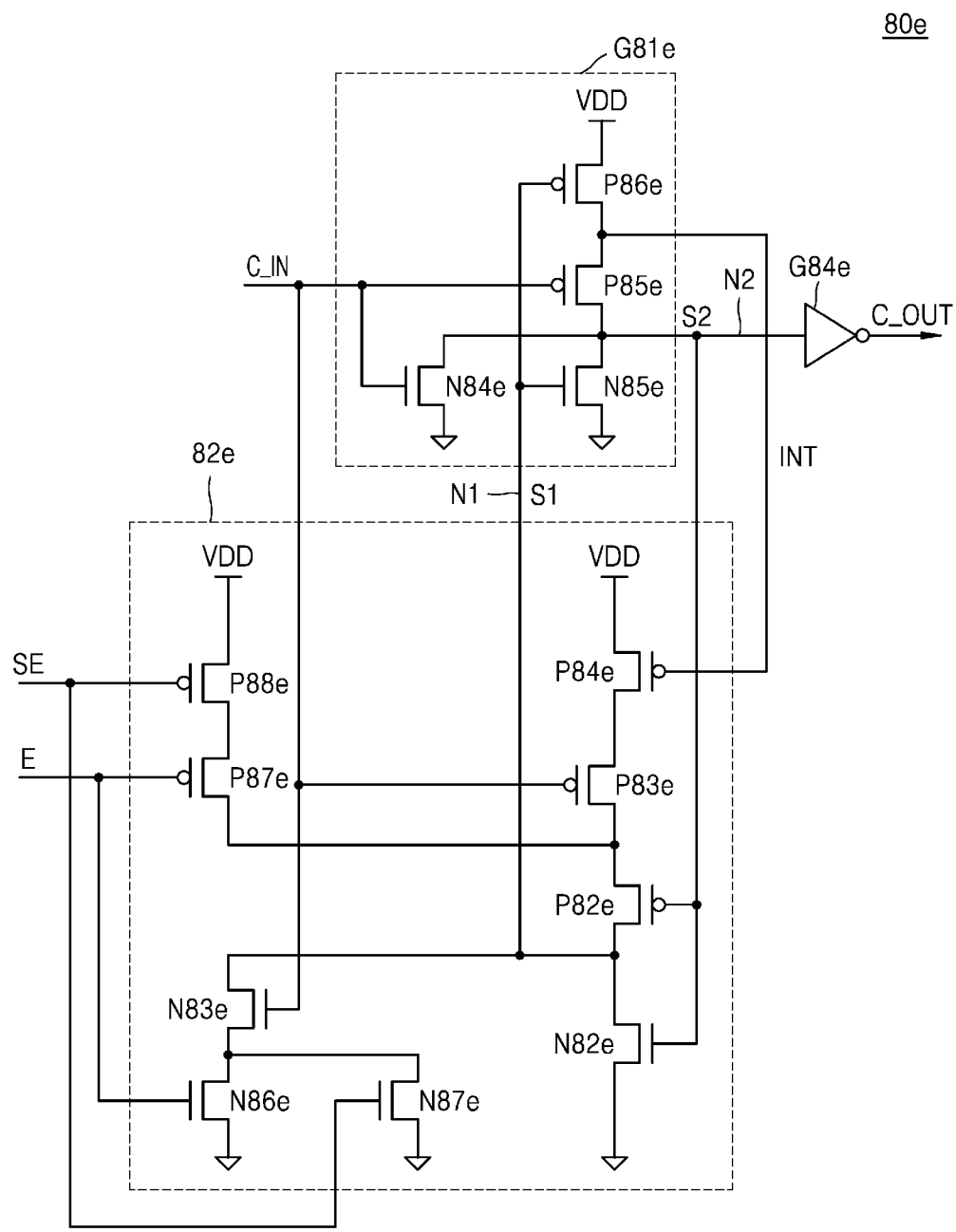

Referring to FIG. 8E, a clock gating cell 80e may include a first NOR gate G81e, a logic circuit 82e, and an inverter G84e. The logic circuit 82e may include a second PFET P82e, a third PFET P83e, a fourth PFET P84e, a second NFET N82e, and a third NFET N83e and may further include a seventh PFET P87e, an eighth PFET P88e, a sixth NFET N86e, and a seventh NFET N87e. Also, the first NOR gate G81e may include a fifth PFET P85e, a sixth PFET P86e, a fourth NFET N84e, and a fifth NFET N85e.

Compared with the clock gating cell 80a of FIG. 8A, the 2-1 AOI gate 82a and OR gate G85a of FIG. 8A may be combined to as the logic circuit 82e of FIG. 8E by sharing at least one transistor. To this end, as shown in FIG. 8E, the logic circuit 82e may include the seventh PFET P87e and the sixth NFET N86e for receiving the clock enable E and include the eighth PFET P88e and the seventh NFET N87e for receiving the test enable SE. Therefore, in the clock gating cell 80e of FIG. 8E, the clock enable E and the test enable SE may be referred to as a first enable input and a second enable input, respectively. In clock gating cells 80b, 80c, and 80d of FIGS. 8B, 8C, and 8D, similar to the clock gating cell 80e of FIG. 8E, it would be understood that, as each of first PFETs P81b, P81c, and P81d are replaced by two PFETs connected to each other in series and each of first NFETs N81b, N81c, and N81d are replaced by two NFETs connected to each other in parallel, a logic circuit for receiving the clock enable E and the test enable SE may be implemented.

Figure 9A:
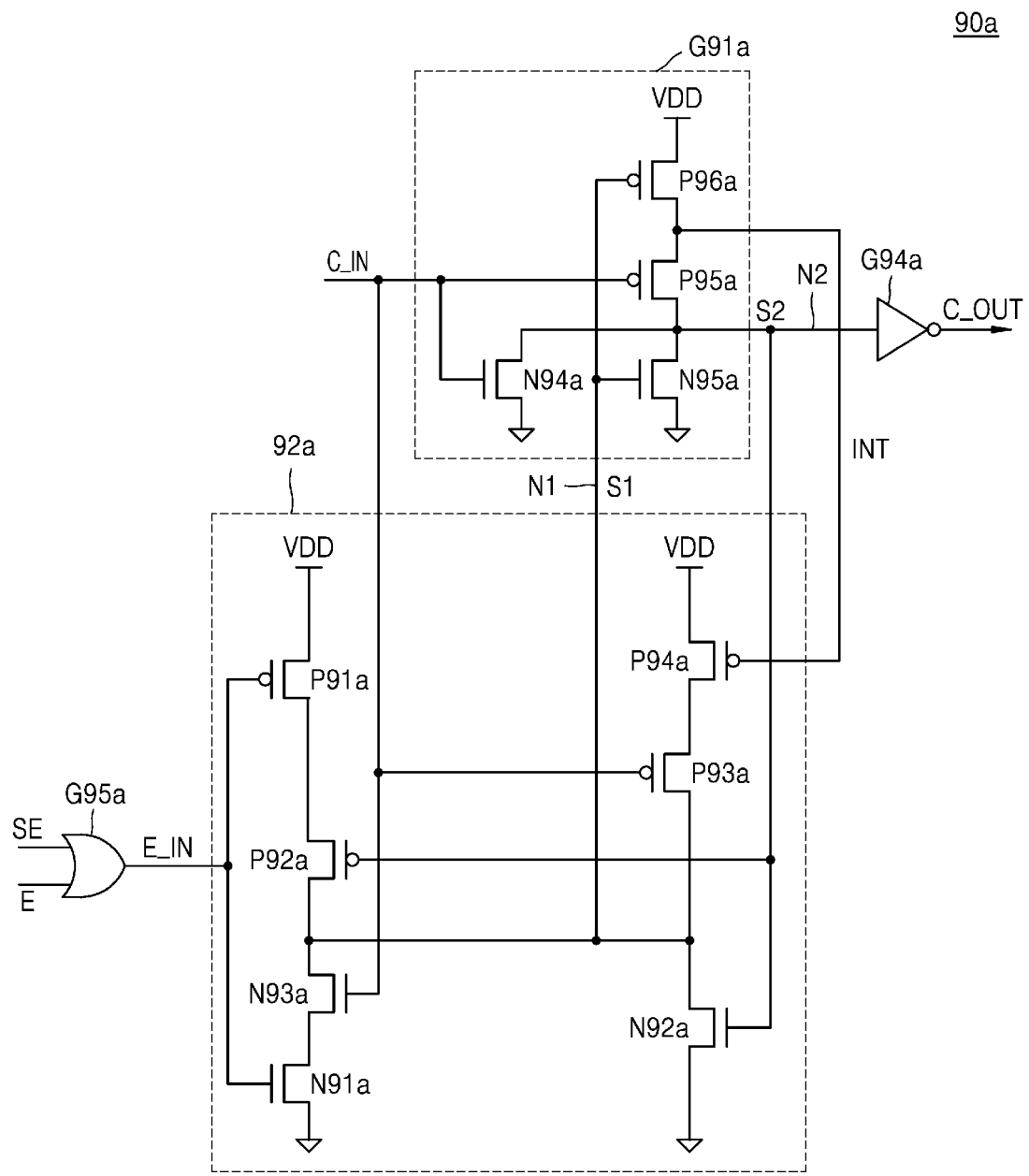
FIGS. 9A to 9C are circuit diagrams showing examples of a clock gating cell according to example embodiments.
Figure 9B:
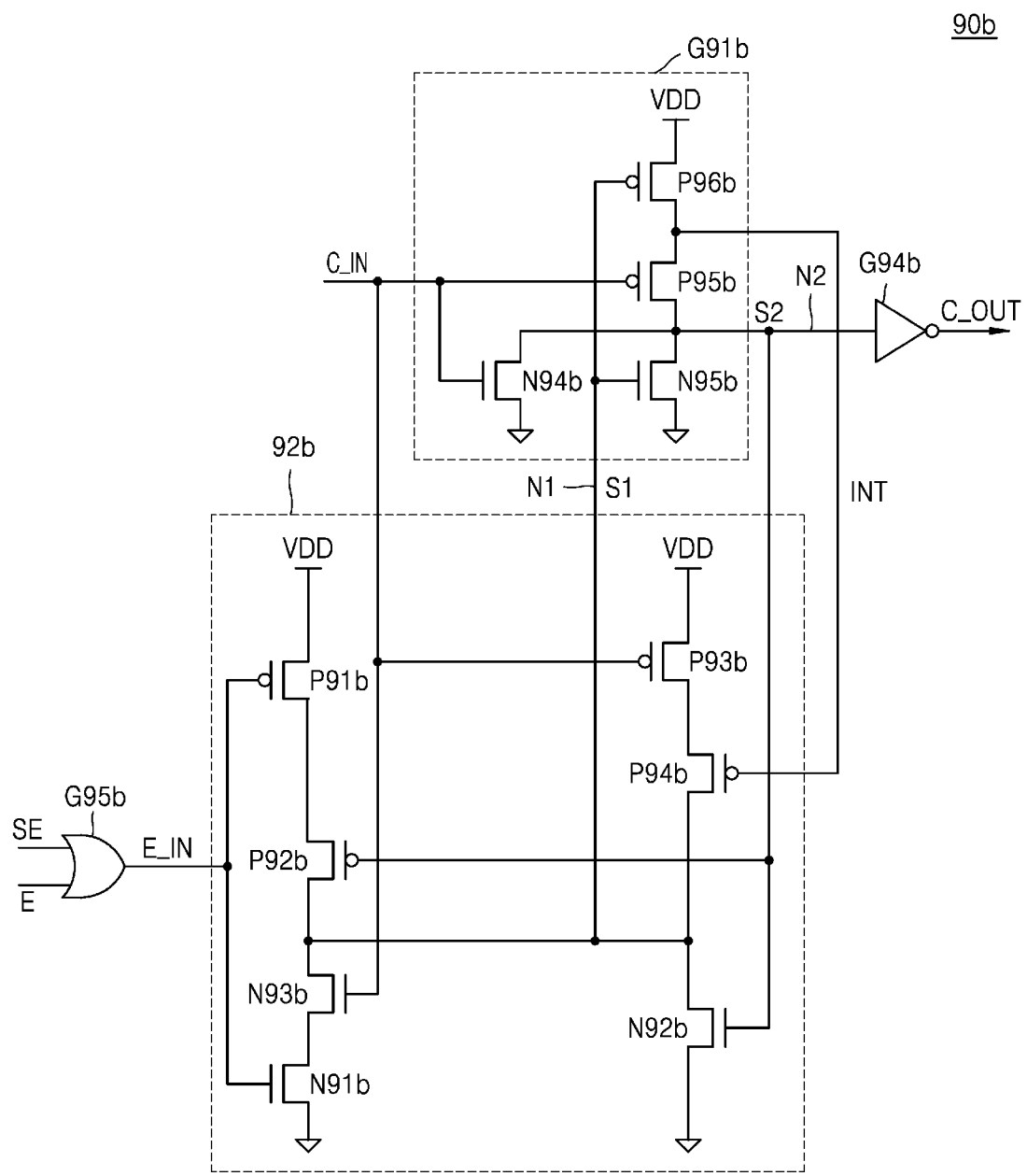
Figure 9C:
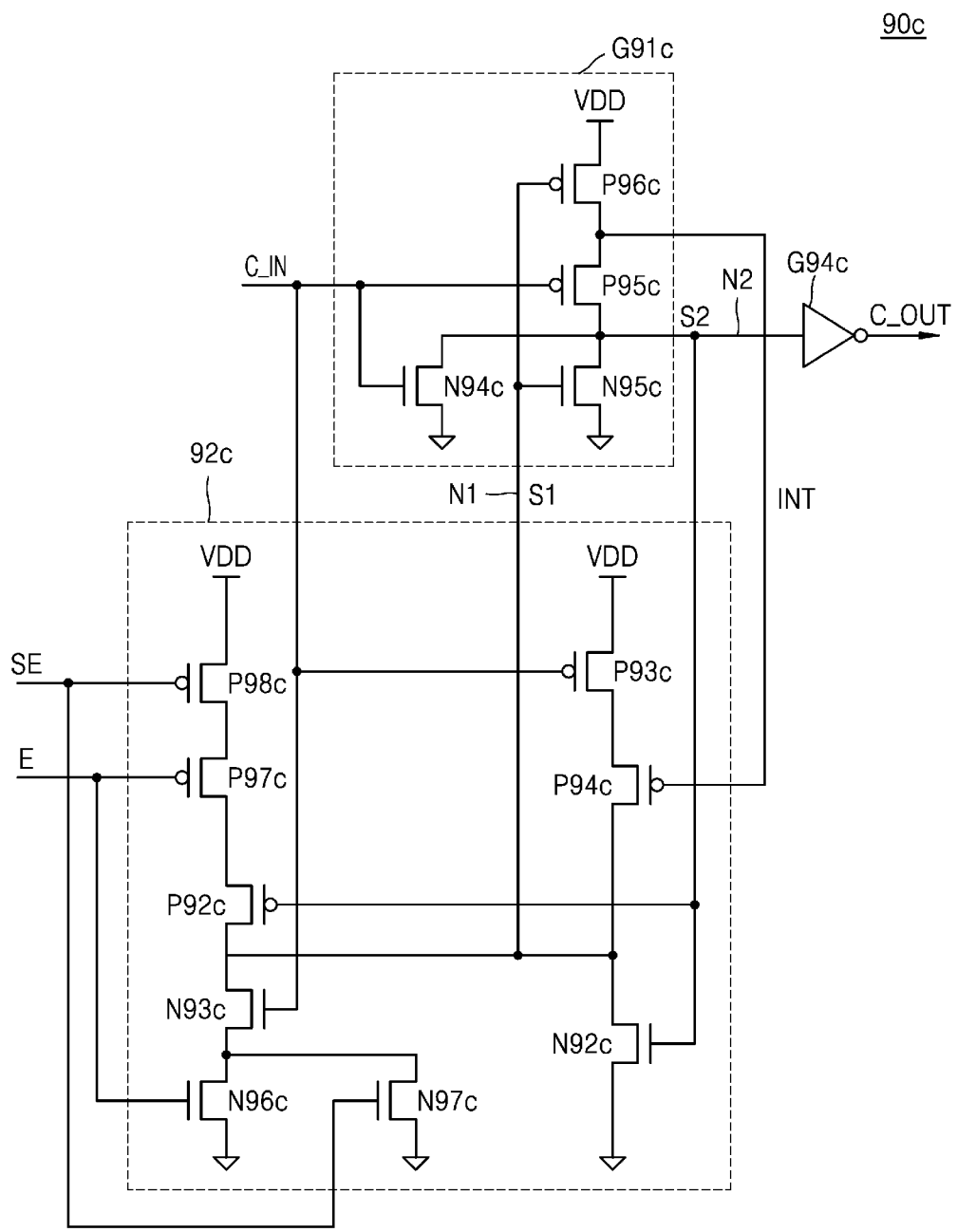

FIGS. 9A to 9C are circuit diagrams showing examples of a clock gating cell according to example embodiments. In detail, the circuit diagrams of FIGS. 9A to 9C show examples of the clock gating cell 60 of FIG. 6, respectively. Unlike clock gating cells 80a to 80e of FIGS. 8A to 8E, a second PFET (e.g., a second PFET P92a of FIG. 9A) for receiving the second signal S2 in clock gating cells 90a, 90b, and 90c of FIGS. 9A to 9C may not be connected in series to a third PFET and a fourth PFET (e.g., a third PFET P93a and a fourth PFET P94a of FIG. 9A) for receiving the clock input C_IN and the internal signal INT, respectively, between the first node N1 and the positive power supply node. Hereinafter, from among descriptions of FIGS. 9A to 9C, repeated descriptions and descriptions identical to those given above with reference to FIGS. 8A to 8E will be omitted.

Referring to FIG. 9A, a clock gating cell 90a may include a first NOR gate G91a, a 2-1 AOI gate 92a, an inverter G94a, and an OR gate G95a. The 2-1 AOI gate 92a may include a first PFET P91a, a second PFET P92a, a third PFET P93a, and a fourth PFET P94a for receiving the enable input E_IN, the second signal S2, the clock input C_IN, and the internal signal INT, respectively, and include a first NFET N91a, a second NFET N92a, and a third NFET N93a for receiving the enable input E_IN, the second signal S2, and the clock input C_IN, respectively. Also, the first NOR gate G91a may include a fifth PFET P95a and a sixth PFET P96a for receiving the clock input C_IN and the first signal S1, respectively, and include a fourth NFET N94a and a fifth NFET N95a for receiving the clock input C_IN and the first signal S1, respectively.

As shown in FIG. 9A, the second PFET P92a and the first PFET P91a may be connected to each other in series between the first node N1 and the positive power supply node. For example, the first PFET P91a may have a drain connected to a source of the second PFET P92a and a source connected to the positive power supply node, and the second PFET P92a may have a drain connected to the first node N1 and may have a source connected to the drain of the first PFET P91a. Also, the third PFET P93a and the fourth PFET P94a may be sequentially connected to each other in series between the first node N1 and the positive power supply node. The fourth PFET P94a is a feedback transistor and may prevent the charging of the first node N1 in response to the internal signal INT. Thus, the race condition described with reference to FIG. 7 is avoided.

Referring to FIG. 9B, a clock gating cell 90b may include a first NOR gate G91b, a 2-1 AOI gate 92b, an inverter G94b, and an OR gate G95b. The 2-1 AOI gate 92b may include a first PFET P91b, a second PFET P92b, a third PFET P93b, and a fourth PFET P94b for receiving the enable input E_IN, the second signal S2, the clock input C_IN, and the internal signal INT, respectively, and include a first NFET N91b, a second NFET N92b, and a third NFET N93b for receiving the enable input E_IN, the second signal S2, and the clock input C_IN, respectively. Also, the first NOR gate G91b may include a fifth PFET P95b and a sixth PFET P96b for receiving the clock input C_IN and the first signal S1, respectively, and include a fourth NFET N94b and a fifth NFET N95b for receiving the clock input C_IN and the first signal S1, respectively.

Compared with the 2-1 AOI gate 92a of FIG. 9A, the third PFET P93b and the fourth PFET P94b may be differently arranged in the 2-1 AOI gate 92b of FIG. 9B. For example, as shown in FIG. 9B, the fourth PFET P94b and the third PFET P93b may be sequentially connected to each other in series between the first node N1 and the positive power supply node, and the second PFET P92b may have a drain connected to the first node N1 (i.e., a drain of the fourth PFET P94b). The fourth PFET P94b is a feedback transistor and may prevent the charging of the first node N1 in response to the internal signal INT. Thus, the race condition described with reference to FIG. 7 is avoided.

Referring to FIG. 9C, a clock gating cell 90c may include a first NOR gate G91c, a logic circuit 92c, and an inverter G94c. The logic circuit 92c may include a second PFET P92c, a third PFET P93c, a fourth PFET P94c, a second NFET N92c, and a third NFET N93c and may further include a seventh PFET P97c, an eighth PFET P98c, a sixth NFET N96c, and a seventh NFET N97c. Also, the first NOR gate G91c may include a fifth PFET P95c, a sixth PFET P96c, a fourth NFET N94c, and a fifth NFET N95c.

Compared with the clock gating cell 90a of FIG. 9A, the 2-1 AOI gate 92a and OR gate G95a of FIG. 9A may be combined to as the logic circuit 92c of FIG. 9C by sharing at least one transistor. To this end, as shown in FIG. 9C, the logic circuit 92c may include the seventh PFET P97c and the sixth NFET N96c for receiving the clock enable E and include the eighth PFET P98c and the seventh NFET N97c for receiving the test enable SE. Therefore, in the clock gating cell 90c of FIG. 9C, the clock enable E and the test enable SE may be referred to as a first enable input and a second enable input, respectively. In the clock gating cell 90b of FIG. 9B, similar to the clock gating cell 90c of FIG. 9C, it would be understood that, as the first PFET P91b is replaced by two PFETs connected to each other in series and the first NFET N91b is replaced by two NFETs connected to each other in parallel, a logic circuit for receiving the clock enable E and the test enable SE may be implemented.

Figure 10:
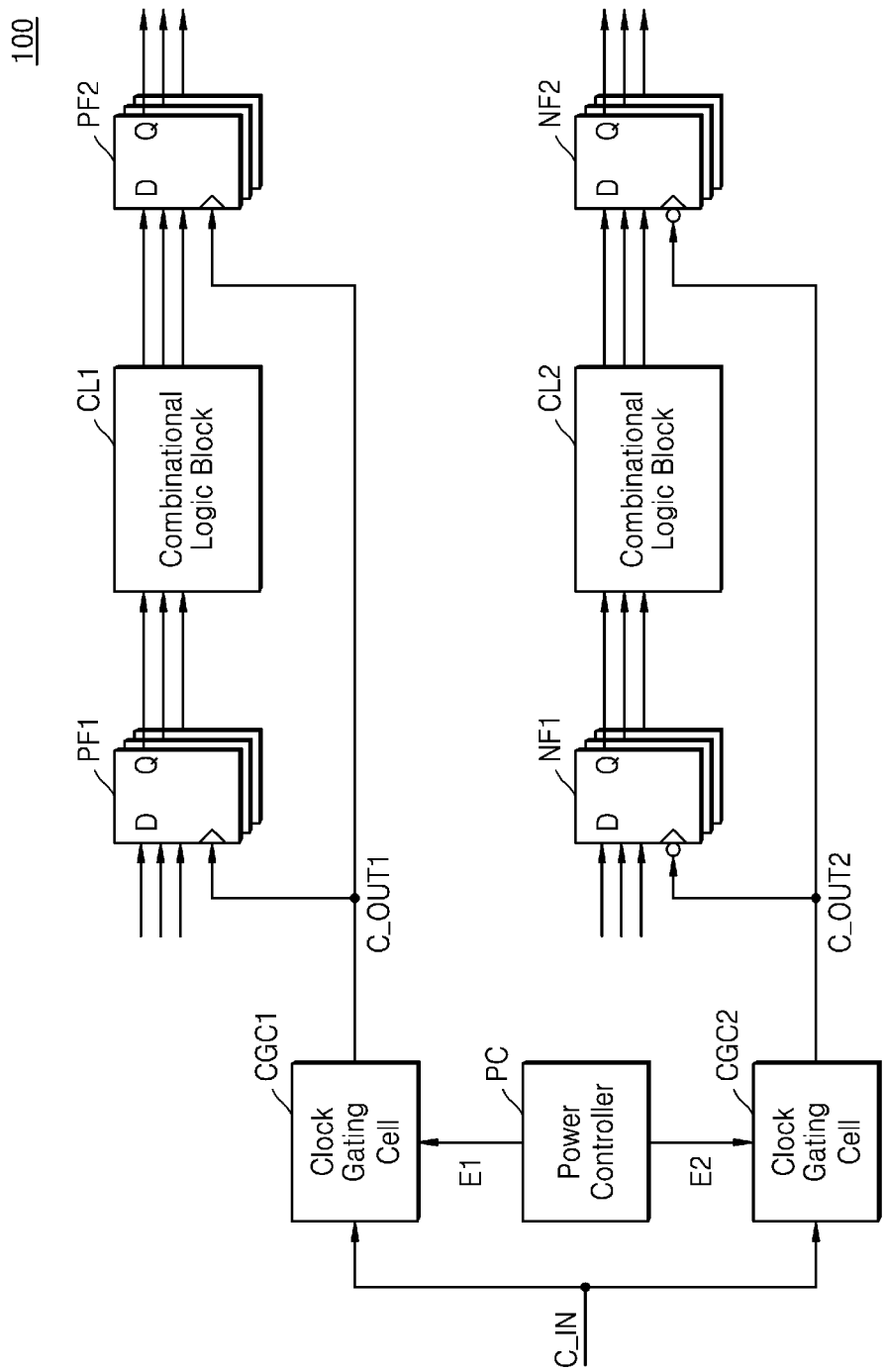
FIG. 10 is a block diagram showing an example of an integrated circuit including a clock gating cell according to an example embodiment.

FIG. 10 is a block diagram showing an example of an integrated circuit including a clock gating cell according to an example embodiment. In some embodiments, the clock gating cells described above with reference to the drawings may be included in an integrated circuit for processing digital signals. As shown in FIG. 10, an integrated circuit 100 may include a first clock gating cell CGC1, a second clock gating cell CGC2, a power controller PC, a first combination logic block CL1, a second combination logic block CL2, and a plurality of flip-flops PF1, PF2, NF1, and NF2.

The power controller PC may control the power of the integrated circuit 100 and may generate a first clock enable E1 and a second clock enable E2. For example, the power controller PC may generate an inactive first clock enable E1 to reduce power consumption by a digital circuit including at least one first positive edge triggered flip-flop PF1, the first combination logic block CL1, and at least one second positive edge triggered flip-flop PF2. Also, the power controller PC may generate an inactive second clock enable E2 to reduce power consumption by a digital circuit including at least one first negative edge triggered flip-flop NF1, the second combination logic block CL2, and at least one second negative edge triggered flip-flop NF2.

The first clock gating cell CGC1 may receive the clock input C_IN and may stop or resume the supply of a first clock output C_OUT1 based on the first clock enable E1. For example, as described above with reference to FIG. 2, the first clock gating cell CGC1 may generate the first clock output C_OUT1 that is maintained at logic '0' in the disabled state. Therefore, the first clock output C_OUT1 may be supplied to a positive edge triggered flip-flop, for example, at least one first positive edge triggered flip-flop PF1 and at least one second positive edge triggered flip-flop PF2. Also, the second clock gating cell CGC2 may receive the clock input C_IN and may stop or resume the supply of a second clock output C_OUT2 based on the second clock enable E2. For example, as described above with reference to FIG. 6, the second clock gating cell CGC2 may generate the second clock output C_OUT2 that is maintained at logic '1' in the disabled state. Therefore, the second clock output C_OUT2 may be supplied to a negative edge triggered flip-flop, for example, at least one first negative edge triggered flip-flop NF1 and at least one second negative edge triggered flip-flop NF2.

FIG. 11 is a flowchart of a method of manufacturing an integrated circuit according to an example embodiment. In detail, the flowchart of FIG. 11 shows a method of manufacturing an integrated circuit IC (e.g., the integrated circuit 100 of FIG. 10) that includes the clock gating cell described above.

In some embodiments, a clock gating cell may be defined as a standard cell. A standard cell is a unit of a layout included in the integrated circuit IC and may be simply referred to as a cell. The integrated circuit IC may include a plurality of different standard cells, each of which may provide a unique function. The standard cells may have a structure complying with pre-set rules based on a semiconductor process for manufacturing the integrated circuit IC. For example, the standard cells may have a constant length or a multiple of the constant length on a plane perpendicular to a direction in which layers are stacked.

A standard cell library (or cell library) D2 may include information regarding standard cells, e.g., function information, characteristic information, layout information, etc., and may include information regarding a clock gating cell. As described above with reference to the drawings, a clock gating cell defined by the standard cell library D2 may not only provide high operational reliability, but also provide high efficiency, e.g., reduced area and low power consumption.

In operation S10, a logic synthesis operation for generating a netlist D3 from RTL data D1 may be performed. For example, a semiconductor design tool (e.g., a logic synthesis tool) may perform a logic synthesis with reference to the standard cell library D2 from the RTL data D1 composed in a VHSIC Hardware Description Language (VHDL) and a Verilog, thereby generating a bitstream or a netlist D3. The standard cell library D2 may include information regarding desirable performance of a clock gating cell, and standard cells may be included in the integrated circuit IC with reference to such information during a logic synthesis process.

In operation S20, a Place&Routing (P&R) operation for generating layout data D4 from the netlist D3 may be performed. As shown in FIG. 11, the P&R operation S20 may include a plurality of sub-operations S21, S22, and S23. In sub-operation S21, an operation for placing standard cells may be performed. For example, a semiconductor design tool (e.g., a P&R tool) may place a plurality of standard cells with reference to the standard cell library D2 from the netlist D3. For example, the semiconductor design tool may place a layout of clock gating cells defined by the netlist D3 with reference to the standard cell library D2. In sub-operation S22, an operation for generating interconnections may be performed. The interconnections may electrically connect output pins and input pins of standard cells and may include, for example, at least one via and at least one conductive pattern. In sub-operation S23, an operation for generating the layout data D4 may be performed. The layout data D4 may have a format, e.g., GDSII, and may include geometric information regarding the standard cells and the interconnections.

In operation S30, an Optical Proximity Correction (OPC) may be performed. An OPC may refer to an operation for forming a pattern of a desired shape by correcting distortion like refraction caused by light characteristics in photolithography included in a semiconductor process for manufacturing the integrated circuit IC, and the pattern on a mask may be determined by applying the OPC to the layout data D4. In some embodiments, the layout of the integrated circuit IC may be limitedly modified in operation S30, and the limited modification of the integrated circuit IC in operation S30 is a post-processing for optimizing the structure of the integrated circuit IC and may be referred to as design polishing.

In operation S40, an operation for manufacturing a mask may be performed. For example, as the OPC is applied to the layout data D4, patterns on a mask may be defined to form patterns to be formed on a plurality of layers, and at least one mask (or a photomask) for forming respective patterns of the plurality of layers may be fabricated.

In operation S50, an operation for manufacturing the integrated circuit IC may be performed. For example, the integrated circuit IC may be manufactured by patterning the plurality of layers by using the at least one mask fabricated in operation S40. As shown in FIG. 11, operation S50 may include sub-operations S51 and S52. In sub-operation S51, a front-end-of-line (FEOL) process may be performed. The FEOL process may refer to a process for forming individual components, e.g., transistors, capacitors, and resistors, on a substrate during manufacturing of the integrated circuit IC. For example, the FEOL process may include a process for planarizing and cleaning a wafer, a process for forming a trench, a process for forming a well, a process for forming a gate line, a process for forming a source and a drain, etc. In sub-operation S52, a back-end-of-line (BEOL) process may be performed. The BEOL process may refer to a process for interconnecting individual components, e.g., transistors, capacitors, and resistors, to one another during manufacturing of the integrated circuit IC. For example, the BEOL process may include a process for silicidation of a gate, a source region, and a drain region, a process for adding a dielectric, a process for planarization, a process for forming a hole, a process for adding a metal layer, a process for forming a via, a process for forming a passivation layer, etc. Next, the integrated circuit IC may be packaged in a semiconductor package and used as a part for various applications. As described above, due to the desirable characteristics of a clock gating cell, the integrated circuit IC may exhibit high performance and efficiency, and, as a result, the performance and the efficiency of an application including the integrated circuit IC may be improved.

While example embodiments have been particularly shown and described, it will be understood that various changes in form and details may be made therein without departing from the spirit and scope of the following claims.

What is claimed is:
1. An integrated circuit comprising:
a clock gating cell,
wherein the clock gating cell comprises:
 a first 2-input logic gate configured to receive a clock input and a first signal and output a second signal;
 an inverter configured to receive the second signal and generate a clock output; and
 a 3-input logic gate comprising a second 2-input logic gate configured to generate the first signal,
wherein the first 2-input logic gate and the second 2-input logic gate form a set reset (SR) latch by being cross-coupled,
wherein the 3-input logic gate comprises a feedback transistor configured to exclusively receive an internal signal of the first 2-input logic gate, wherein the internal signal is generated inside the first 2-input logic gate and is different from the clock input, the first signal and the second signal, and wherein an activation of the feedback transistor by the internal signal is configured to avoid a race condition by preventing a pull-up or a pull-down of a first node at which the first signal is generated.

2. The integrated circuit of claim 1, further comprising at least one positive edge triggered flip-flop configured to receive the clock output from the clock gating cell, wherein the first 2-input logic gate is a first NAND gate and the second 2-input logic gate is a second NAND gate, the 3-input logic gate is a 2-1 OR-AND-INVERTER (OAI) gate, and the feedback transistor is an n-channel field effect transistor (NFET) configured to prevent the pull-down of the first node.

3. The integrated circuit of claim 1, further comprising at least one negative edge triggered flip-flop configured to receive the clock output from the clock gating cell, wherein the first 2-input logic gate is a first NOR gate and the second 2-input logic gate is a second NOR gate, the 3-input logic gate is a 2-1 AND-OR-INVERTER (MN) gate, and the feedback transistor is a p-channel field effect transistor (PFET) configured to prevent the pull-up of the first node.

4. A clock gating cell comprising:

a first NAND gate configured to receive a clock input, and a first signal and generate a second signal;

an inverter configured to receive the second signal and generate a clock output; and a 2-1 OR-AND-INVERTER (OAT) gate comprising a second NAND gate configured to generate the first signal, wherein the first NAND gate and the second NAND gate form a set reset (SR) latch by being cross-coupled, and wherein the 2-1 OAT gate comprises:

a first n-channel field effect transistor (NFET) configured to receive an inverted enable input;

a second NFET configured to receive the second signal;

a third NFET configured to receive the clock input; and a fourth NFET connected in series with the third NFET between a first node at which the first signal is generated and a ground node, the fourth NFET being configured to exclusively receive an internal signal of the first NAND gate to avoid a race condition.

5. The clock gating cell of claim 4, wherein the second NFET is connected in series to the third NFET and the fourth NFET between the first node and the ground node.

6. The clock gating cell of claim 5, wherein the second NFET, the third NFET, and the fourth NFET are sequentially connected to one another in series between the first node and the ground node, a drain terminal of the first NFET is connected to both a source terminal of the second NFET and a drain terminal of the third NFET, and a source terminal of the first NFET is connected to the ground node.

7. The clock gating cell of claim 5, wherein the second NFET, the fourth NFET, and the third NFET are sequentially connected to one another in series between the first node and the ground node, a drain terminal of the first NFET is connected to both a source terminal of the second NFET and a drain terminal of the fourth NFET, and a source terminal of the first NFET is connected to the ground node.

8. The clock gating cell of claim 5, wherein the third NFET, the fourth NFET, and the second NFET are sequentially connected to one another in series between the first node and the ground node, a drain terminal of the first NFET is connected to a drain terminal of the third NFET, and a source terminal of the first NFET is connected to both a source terminal of the fourth NFET and a drain terminal of the second NFET.

9. The clock gating cell of claim 5, wherein the fourth NFET, the third NFET, and the second NFET are sequentially connected to one another in series between the first node and the ground node, a drain terminal of the first NFET is connected to a drain terminal of the fourth NFET, and a source terminal of the first NFET is connected to both a source terminal of the third NFET and a drain terminal of the second NFET.

10. The clock gating cell of claim 4, wherein a drain terminal the first NFET is connected to a source terminal of the second NFET, a source terminal of the first NFET is connected to the ground node, and a drain terminal of the second NFET is connected to the first node.

11. The clock gating cell of claim 10, wherein the third NFET and the fourth NFET are sequentially connected to each other in series between the first node and the ground node.

12. The clock gating cell of claim 10, wherein the fourth NFET and the third NFET are sequentially connected to each other in series between the first node and the ground node.

13. The clock gating cell of claim 4, wherein the 2-1 OAT gate further comprises:

a first p-channel field effect transistor (PFET) configured to receive the inverted enable input;

a second PFET configured to receive the second signal; and a third PFET configured to receive the clock input.

14. The clock gating cell of claim 4, wherein the first NAND gate comprises a fifth NFET and a sixth NFET connected to each other in series between a second node at which the second signal exists and the ground node, the fifth NFET is configured to receive the clock input;

the sixth NFET is configured to receive the first signal, and the internal signal exists at a third node interconnecting the fifth NFET and the sixth NFET.

15. The clock gating cell of claim 14, wherein the fifth NFET comprises a drain terminal connected to the second node, and the sixth NFET comprises a source terminal connected to the ground node.

16. The clock gating cell of claim 14, wherein the first NAND gate further comprises:

a fourth p-channel field effect transistor (PFET) configured to receive the clock input; and a fifth PFET configured to receive the first signal.

17. A clock gating cell comprising:

a first NOR gate configured to receive a clock input and a first signal and generate a second signal;

an inverter configured to receive the second signal and generate a clock output; and a 2-1 AND-OR-INVERTER (AOI) gate comprising a second NOR gate configured to generate the first signal, wherein the first NOR gate and the second NOR gate form a set reset (SR) latch by being cross-coupled, and wherein the 2-1 AOI gate comprises:
- a first p-channel field effect transistor (PFET) configured to receive an enable input;
- a second PFET configured to receive the second signal;
- a third PFET configured to receive the clock input; and
- a fourth PFET connected in series with the third PFET between a first node at which the first signal is generated and a positive power supply node, wherein the fourth PFET is configured to exclusively receive an internal signal of the first NOR gate, and an activation of the fourth PFET is configured to avoid a race condition.

18. The clock gating cell of claim 17, wherein the second PFET is connected in series to the third PFET and the fourth PFET between the first node and the positive power supply node.

19. The clock gating cell of claim 17, wherein a drain terminal of the first PFET is connected to a source terminal of the second PFET, a source terminal of the first PFET is connected to the positive power supply node, and the second PFET has a drain terminal connected to the first node.

20. The clock gating cell of claim 17, wherein the first NOR gate comprises a fifth PFET and a sixth PFET connected to each other in series between a second node at which the second signal exists and the positive power supply node, the fifth PFET is configured to receive the clock input, the sixth PFET is configured to receive the first signal, and the internal signal exists at a node interconnecting the fifth PFET and the sixth PFET.

* * * * *